(12) United States Patent
Higuchi et al.

(10) Patent No.: US 9,391,595 B2
(45) Date of Patent: Jul. 12, 2016

(54) CLOCK SIGNAL GENERATION CIRCUIT, DETECTION DEVICE, SENSOR, ELECTRONIC APPARATUS, AND MOVING OBJECT

(71) Applicant: Seiko Epson Corporation, Tokyo (JP)

(72) Inventors: Teppei Higuchi, Chino (JP); Masafumi Tanaka, Suwa (JP); Katsuhiko Maki, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/552,979

(22) Filed: Nov. 25, 2014

(65) Prior Publication Data

US 2015/0145609 A1 May 28, 2015

(30) Foreign Application Priority Data

Nov. 27, 2013 (JP) ................................. 2013-244626

(51) Int. Cl.
*H03B 5/04* (2006.01)
*H03K 3/03* (2006.01)
*H03K 3/011* (2006.01)

(52) U.S. Cl.
CPC . *H03K 3/03* (2013.01); *H03K 3/011* (2013.01)

(58) Field of Classification Search
None
See application file for complete search history.

(56) References Cited

U.S. PATENT DOCUMENTS

| 4,414,515 | A | * | 11/1983 | Suzuki | H03K 3/023 331/111 |
| 5,180,995 | A | | 1/1993 | Hayashi et al. | |
| 6,462,625 | B2 | * | 10/2002 | Kim | H03B 5/04 331/176 |
| 7,863,942 | B2 | * | 1/2011 | Morino | G06F 1/28 327/77 |
| 9,112,510 | B2 | * | 8/2015 | Ishikawa | H03L 7/00 |

FOREIGN PATENT DOCUMENTS

| JP | 06-169237 A | 6/1994 |
| JP | 2002-033644 A | 1/2002 |

\* cited by examiner

*Primary Examiner* — An Luu
(74) *Attorney, Agent, or Firm* — Harness, Dickey & Pierce, P.L.C.

(57) ABSTRACT

A clock signal generation circuit includes a CR oscillator circuit having a capacitor, a resistor, and an amplifier circuit, and a voltage generation circuit adapted to generate a power supply voltage, and then supply the CR oscillator circuit 170 with the power supply voltage VDOS. An oscillation frequency of the CR oscillator circuit in a case in which a power supply voltage VDDL is a fixed voltage has a positive temperature characteristic. The voltage generation circuit generates the power supply voltage VDOS having a negative temperature characteristic based on a work function difference between transistors, and then supplies the power supply voltage VDOS as a power of the amplifier circuit of the CR oscillator circuit.

20 Claims, 22 Drawing Sheets

VDOS FIXED

BEFORE CUTTING FUSE

AFTER CUTTING FUSE

BEFORE CUTTING FUSE; FIRST MEASUREMENT MODE

BEFORE CUTTING FUSE; SECOND MEASUREMENT MODE

AFTER CUTTING FUSE

| | REGULATOR CIRCUIT | VOLTAGE GENERATION CIRCUIT | CR OSCILLATOR CIRCUIT | DRIVE CIRCUIT | DETECTION CIRCUIT | DSP |
|---|---|---|---|---|---|---|
| NORMAL OPERATION | OPERATION | OPERATION | OPERATION | OPERATION | OPERATION | OPERATION |
| STANDBY | OPERATION | OPERATION | OPERATION | OPERATION | STOP | STOP |
| SLEEP | OPERATION | STOP | STOP | STOP | STOP | STOP |

FIG. 15

CLOCK SIGNAL GENERATION CIRCUIT, DETECTION DEVICE, SENSOR, ELECTRONIC APPARATUS, AND MOVING OBJECT

BACKGROUND

1. Technical Field

The present invention relates to a clock generation circuit, a detection device, a sensor, an electronic apparatus, and a moving object.

2. Related Art

In the past, there has been known a clock generation circuit using an oscillator circuit. In such an oscillator circuit, there is performed a temperature compensation for reducing the fluctuation of the oscillation frequency with respect to a temperature variation. As the related art of the temperature compensation of the oscillator circuit, there have been known technologies disclosed in JP-A-6-169237 (Document 1) and JP-A-2002-33644 (Document 2).

In the related art of Document 1, for example, the temperature compensation of the oscillation frequency is realized by supplying a ring oscillator circuit having a negative temperature characteristic with a bias current having a positive temperature characteristic.

In the related art of Document 2, the temperature compensation of the oscillation frequency is realized by constituting a resistance part of a CR oscillator circuit by two types of resistors different in temperature characteristic from each other.

However, in the related art described above, a reference voltage generation circuit, one or more operational amplifiers, and an amplifier circuit (a buffer circuit) become necessary, and there is a problem that the current consumption and the circuit size increase. Further, although in the related art of Document 2, a diffused resistor of P+ is used for the temperature compensation, since the sheet resistance value of the diffused resistor of P+ is low, the occupation area of the diffused resistor of P+ becomes large in order to ensure a necessary delay amount, and there is a problem that the layout area of the circuit device increases.

Further, a gyro sensor for detecting a physical quantity varied due to an external factor is incorporated in an electronic apparatus such as a digital camera or a smartphone, or a moving object such as a vehicle or a plane. The gyro sensor detects a physical quantity such as angular velocity, and is used for a so-called image stabilization, posture control, GPS autonomous navigation, and so on. As one of the gyro sensors, there has been known a crystal piezoelectric vibration type gyro sensor using a crystal oscillator.

In such a gyro sensor, the control section of the detection device is made to operate using a clock signal having the same frequency (e.g., 100 kHz) as the oscillation frequency (a drive frequency) of the crystal oscillator. For example, the control section is made operate using a sync signal for synchronous detection generated by a drive circuit of the detection device as a clock signal. Therefore, since the frequency of the clock signal becomes a frequency as low as, for example, 100 kHz, a high-speed operation of the control section cannot be realized. Further, since the stable clock signal cannot be obtained until the oscillation of the crystal oscillator is stabilized, the start-up time until the beginning of detection of a desired signal is delayed, and there is a problem that it takes long time before appropriate angular velocity data is output. Further, in the case of adopting a configuration of a digital gyro incorporating an A/D converter circuit and a digital signal processing section in the detection device, there is also a problem that the digital processing such as a digital filter process cannot be performed at high speed if the frequency of the clock signal is low.

SUMMARY

An advantage of some aspects of the invention is to provide a clock signal generation circuit, a detection device, a sensor, an electronic apparatus, a moving object, and so on capable of realizing the temperature compensation of the oscillation frequency while suppressing an increase in current consumption and circuit size, and so on.

Another advantage of some aspects of the invention provide a clock signal generation circuit, a detection device, a sensor, an electronic apparatus, a moving object, and so on capable of realizing speeding-up of processing of a control section and shortening of the start-up time while keeping the detection performance.

The invention can be implemented as the following aspects or embodiments.

An aspect of the invention relates to a clock signal generation circuit including a CR oscillator circuit including a capacitor, a resistor, and an amplifier circuit, and a voltage generation circuit adapted to generate a power supply voltage, and supply the CR oscillator circuit with the power supply voltage, wherein an oscillation frequency of the CR oscillator circuit in a case in which the power supply voltage is a fixed voltage has a positive temperature characteristic, and the voltage generation circuit generates the power supply voltage having a negative temperature characteristic based on a work function difference between transistors, and supplies the power supply voltage as a power for the amplifier circuit of the CR oscillator circuit.

According to the aspect of the invention, the power supply voltage having a negative temperature characteristic is generated, and supplied to the CR oscillator circuit having a positive temperature characteristic of the oscillation frequency in the case in which the power supply voltage is a fixed voltage, and thus the clock signal is generated. According to this configuration, since at least a part of the positive temperature characteristic of the oscillation frequency of the CR oscillator circuit is canceled out with the negative temperature characteristic of the power supply voltage, the frequency variation in the clock signal to the temperature variation can be reduced. Therefore, it becomes possible to provide the clock signal generation circuit realizing the temperature compensation of the oscillation frequency while suppressing the current consumption and the increase in the circuit size.

In the aspect of the invention, the resistor may include a plurality of resistor elements and a reference resistor element connected in series to each other, a plurality of fuse elements disposed corresponding respectively to the resistor elements in parallel to the corresponding resistor elements, and a trimming auxiliary switch disposed in parallel to the reference resistor element, set to an OFF state in a first measurement mode of an oscillation frequency before cutting the fuse element, and set to an ON state in a second measurement mode of the oscillation frequency before cutting the fuse element.

According to this configuration, it becomes possible to measure the oscillation frequency while setting the trimming auxiliary switch to the OFF state in the first measurement mode before cutting the fuse element, and measure the oscillation frequency while setting the trimming auxiliary switch to the ON state in the second measurement mode. Further, it becomes possible to determine what of the fuse elements should be cut using the oscillation frequencies thus measured.

Another aspect of the invention relates to a detection device including the clock signal generation circuit described above, a drive circuit adapted to receive a feedback signal from a physical quantity transducer and drive the physical quantity transducer, a detection circuit adapted to receive a detection signal from the physical quantity transducer to detect a desired signal, and a control section adapted to receive the clock signal from the clock signal generation circuit, and control the drive circuit and the detection circuit.

According to this configuration, it is possible to make the control section operate using the clock signal generated by the clock signal generation circuit having the CR oscillator circuit to control the drive circuit and the detection circuit. Thus, it is possible to realize speeding-up of the process of the control section and speeding-up of the start-up of the drive circuit and the detection circuit.

In the another aspect of the invention, the clock signal generation circuit may be set to an operation enable state by releasing a power-on reset state, and supply the control section with the clock signal, and the control section having started an operation due to the supply of the clock signal may start up the drive circuit and the detection circuit.

According to this configuration, the operation of the clock signal generation circuit is started to generate the clock signal by releasing the power-on reset, and it becomes possible to start up the drive circuit and the detection circuit by the control section operating based on the clock signal.

Still another aspect of the invention relates to a detection device including a clock signal generation circuit adapted to generate a clock signal using a CR oscillator circuit, a drive circuit adapted to receive a feedback signal from a physical quantity transducer and drive the physical quantity transducer, a detection circuit adapted to receive a detection signal from the physical quantity transducer to detect a desired signal, and a control section adapted to receive the clock signal from the clock signal generation circuit, and control the drive circuit and the detection circuit, wherein the CR oscillator circuit operates being supplied with a power supply voltage having a negative temperature characteristic, the clock signal generation circuit is set to an operation enable state by releasing a power-on reset state, and supplies the control section with the clock signal, and the control section having started an operation due to the supply of the clock signal starts up the drive circuit and the detection circuit.

According to this configuration, it is possible to make the control section operate using the clock signal generated by the clock signal generation circuit having the CR oscillator circuit to control the drive circuit and the detection circuit. Thus, it is possible to realize speeding-up of the process of the control section and speeding-up of the start-up of the drive circuit and the detection circuit. Further, by supplying the power supply voltage having a negative temperature characteristic to the CR oscillator circuit to generate the clock signal, the frequency variation of the clock signal with respect to the temperature variation can also be reduced.

In the still another aspect of the invention, the physical quantity transducer may be a vibrator, the drive circuit may include an amplifier circuit adapted to amplify the feedback signal, a drive signal output circuit adapted to output a drive signal of the vibrator, a gain control circuit adapted to control an amplitude of the drive signal, and a high-pass filter disposed between the amplifier circuit and the drive signal output circuit, and the clock signal from the clock signal generation circuit may be input to the drive signal output circuit via a resistor element constituting the high-pass filter in a start-up period of an oscillation of the vibrator.

According to this configuration, generation and growth of the seed of the oscillation of the vibrator can be realized by making an effective use of the clock signal from the clock signal generation circuit, and thus, shortening of the oscillation start-up period and so on can be achieved.

In the still another aspect of the invention, the detection device may further include a second drive circuit adapted to receive a second feedback signal from a second physical quantity transducer, and drive the second physical quantity transducer, and a second detection circuit adapted to receive a second detection signal from the second physical quantity transducer to detect a desired signal, and the detection circuit may include a first A/D converter circuit, the second detection circuit may include a second A/D converter circuit, and the first A/D converter circuit and the second A/D converter circuit each may convert an analog signal into a digital signal based on the clock signal from the clock signal generation circuit.

According to this configuration, it is possible to make the first and second A/D converter circuits operate based on the clock signal from the clock signal generation circuit, and thus the simplification of the system design and so on can be achieved.

In the still another aspect of the invention, the control section may include a digital signal processing section adapted to receive the digital signals from the first A/D converter circuit and the second A/D converter circuit, and perform digital signal processing on the digital signals, and the digital signal processing section may perform the digital signal processing based on the clock signal from the clock signal generation circuit.

According to this configuration, since it is possible to make the digital signal processing section for performing the digital signal processing of the digital signals from the first and second A/D converter circuits operate using the clock signal from the clock signal generation circuit, further simplification of the system design and so on can be achieved.

In the still another aspect of the invention, the physical quantity transducer may be a vibrator adapted to detect a rotational angular velocity around a first axis, the second physical quantity transducer may be a second vibrator adapted to detect a rotational angular velocity around a second axis, the vibrator may vibrate at a first frequency, and the second vibrator may vibrate at a second frequency different from the first frequency.

According to this configuration, the inter-axis interference when detecting the rotational angular velocities around a plurality of rotational axes can effectively be reduced.

In the still another aspect of the invention, the detection device may further include a power supply terminal to which an external power supply voltage is input, and a regulator circuit adapted to perform a voltage adjustment of stepping down the external power supply voltage from the power supply terminal, and supply a regulated power supply voltage obtained by the voltage adjustment to the drive circuit and the detection circuit as an operating power supply voltage, and the voltage generation circuit may generate the power supply voltage based on the regulated power supply voltage.

By making the drive circuit and the detection circuit operate with the regulated power supply voltage as described above, it is possible to inhibit the situation of the deterioration of the detection performance due to the power supply voltage variation, and thus, an improvement in the detection performance of the detection device and so on can be achieved. Further, since the voltage generation circuit generates the power supply voltage based on the regulated power supply voltage, it is possible to reduce the frequency variation of the clock signal not only to the temperature variation but also to the power supply voltage variation.

In the still another aspect of the invention, the detection device may further include a buffer circuit supplied with the external power supply voltage, and adapted to receive a drive signal from the drive circuit, and output an amplified drive signal, which is obtained by increasing an amplitude of the drive signal, to the physical quantity transducer.

As described above, by making the buffer circuit operate with the power supply voltage instead of the regulated power supply voltage, it becomes possible to output the amplified drive signal obtained by increasing the amplitude of the drive signal from the drive circuit to the physical quantity transducer. Therefore, it becomes possible to realize both of shortening of the start-up time of the oscillation of the vibrator and an improvement in the detection performance.

In the still another aspect of the invention, the amplified drive signal from the buffer circuit may be output to the physical quantity transducer in a first mode, and the drive signal from the drive circuit may be output to the physical quantity transducer in a second mode.

According to this configuration, it becomes possible to set the first mode in the case in which the drive with the amplified drive signal is necessary, and to set the second mode in the case in which the drive with the normal drive signal is desirable, and the convenience can be enhanced.

In the still another aspect of the invention, the physical quantity transducer may be a vibrator, and the first mode may be set to output the amplified drive signal from the buffer circuit to the vibrator in a start-up period of an oscillation of the vibrator.

According to this configuration, since the drive with the amplified drive signal is performed during the start-up period of the oscillation of the vibrator as the physical quantity transducer, shortening of the start-up time of the oscillation of the vibrator can be achieved.

Yet another aspect of the invention relates to a sensor including any of the detection devices described above, and the physical quantity transducer.

Still yet another aspect of the invention relates to an electronic apparatus including the clock signal generation circuit described above.

Further another aspect of the invention relates to a moving object including the clock signal generation circuit described above.

BRIEF DESCRIPTION OF THE DRAWINGS

The invention will be described with reference to the accompanying drawings, wherein like numbers reference like elements.

FIG. 15 is an explanatory diagram of a normal operation, a standby mode, and a sleep mode.

DESCRIPTION OF AN EXEMPLARY EMBODIMENT

Hereinafter, a preferred embodiment of the invention will be explained in detail. It should be noted that the present embodiment explained below do not unreasonably limit the content of the invention as set forth in the appended claims, and all of the constituents set forth in the present embodiment are not necessarily essential as means of the invention for solving the problems.

1. Clock Signal Generation Circuit

Figure 1:
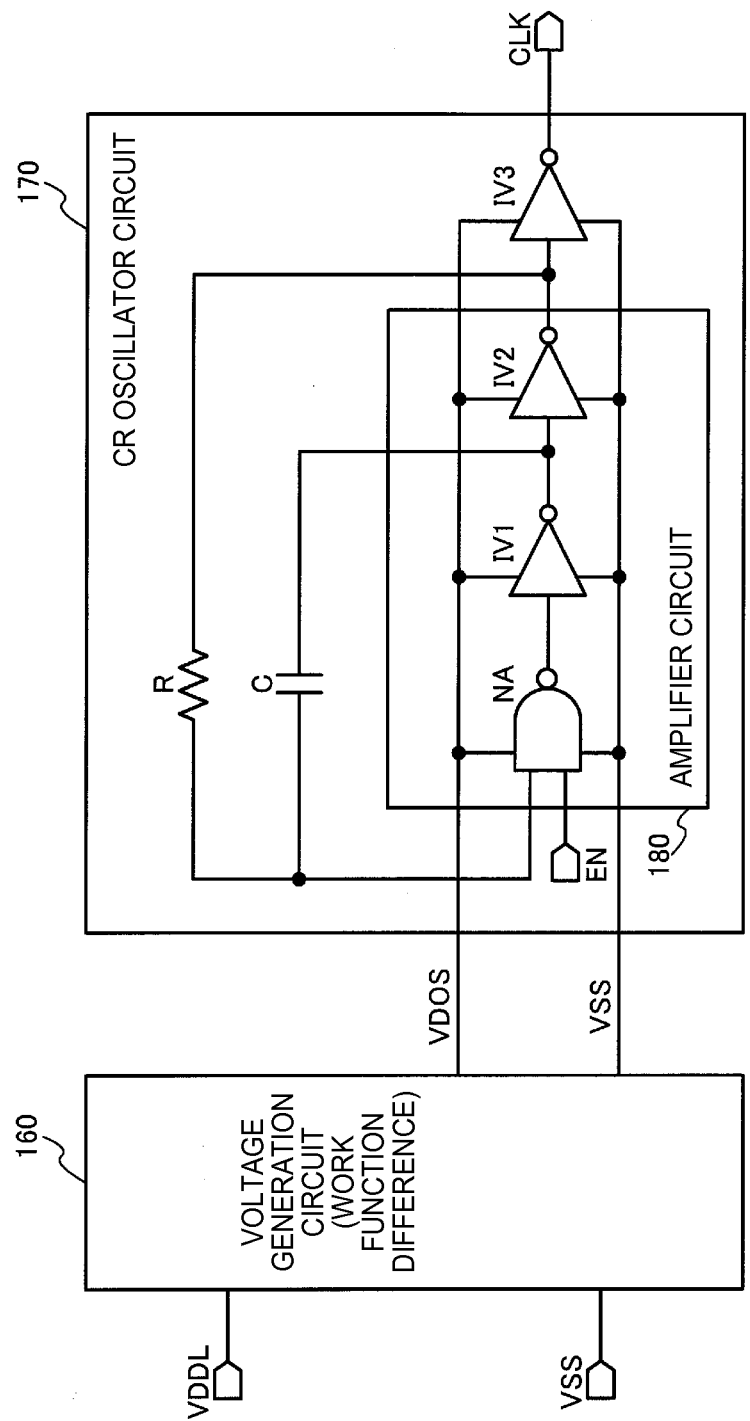
FIG. 1 is a diagram showing a configuration example of a clock generation circuit according to an embodiment of the invention.

FIG. 1 shows a configuration example of a clock signal generation circuit according to the present embodiment. The clock signal generation circuit includes a voltage generation circuit 160 and a CR oscillator circuit 170. It should be noted that the clock signal generation circuit is not limited to the configuration shown in FIG. 1, but various practical modifications such as elimination of some of the constituents or addition of other constituents are possible.

The voltage generation circuit 160 generates a power supply voltage VDOS, and then supplies the CR oscillator circuit 170 with the power supply voltage VDOS. For example, the voltage generation circuit 160 generates and then supplies the power supply voltage VDOS based on a work function difference.

The CR oscillator circuit 170 includes a capacitor C, a resistor R, and an amplifier 180 (a buffer circuit). The CR oscillator circuit 170 operates in response to the supply with the power supply voltage VDOS, and generates a clock signal CLK (an oscillation signal). Specifically, the CR oscillator circuit 170 feeds back a signal to the input using an RC circuit formed of the capacitor C and the resistor R to thereby generate the oscillation signal, and then outputs a signal obtained by shaping the waveform of the oscillation signal as the clock signal CLK.

The amplifier circuit 180 (an inverting amplifier circuit) includes an NAND circuit NA and inverter circuits IV1, IV2. The output of the inverter circuit IV1 is fed back to the input of the amplifier circuit 180 via the capacitor C. The output of the inverter circuit IV2 is fed back to the input of the amplifier circuit 180 via the resistor R. A first input of the NAND circuit NA corresponds to the input of the amplifier circuit 180, and an enable signal EN is input to a second input of the NAND circuit NA. When the enable signal EN is set to an H level, the CR oscillator circuit 170 is set to an operation enable state, and when the enable signal EN is set to an L level, the CR oscillator circuit 170 is set to an operation disable state.

The oscillation signal output from the inverter circuit IV2 is shaped in the waveform by an inverter circuit IV3, and is output as the clock signal CLK having a rectangular waveform. For example, the oscillation signal has a waveform with a rising edge and a falling edge rounded. The inverter circuit IV3 shapes the waveform of the oscillation signal having such a waveform into a rectangular waveform with steep rising and falling edges. It should be noted that it is also possible to arrange that a frequency divider circuit is disposed in a posterior stage of the inverter circuit IV3, and one or a plurality of clock signals obtained by frequency-dividing the clock signal CLK is output.

The voltage generation circuit 160 generates the power supply voltage VDOS having, for example, a negative temperature characteristic (a first temperature characteristic) based on the work function difference between transistors, and then supplies the power supply voltage VDOS as a power of the amplifier circuit 180 of the CR oscillator circuit 170. For example, the voltage generation circuit 160 (a regulator circuit) is supplied with a power supply voltage VDDL on the high-potential side and a power supply voltage VSS (GND) on the low-potential side. Further, as described later, the voltage generation circuit 160 includes a first transistor and a second transistor different in conductivity of the gate electrode from the first transistor. For example, in the case in which the gate electrode of the first transistor is an N type, the gate electrode of the second transistor is arranged to be set to a P type. Further, the voltage generation circuit 160 supplies a voltage corresponding to the work function difference between the first and second transistors as the power supply voltage VDOS. In other words, the voltage generation circuit 160 supplies the power supply voltage VDOS based on the word function difference between the gates different in type from each other. The power supply voltage VDOS has, for example, a negative temperature characteristic, and the power supply voltage VDOS lowers as the temperature rises.

In contrast, the oscillation frequency of the CR oscillator circuit 170 has a positive temperature characteristic in the case in which the power supply voltage VDOS is a fixed voltage (constant). In other words, in the condition in which the power supply voltage VDOS is fixed, the oscillation frequency rises as the temperature rises.

For example, the oscillation frequency of the CR oscillator circuit 170 in the case in which an influence of a signal delay of the NAND circuit NA and the inverter circuits IV1, IV2 is eliminated is defined as f0. Then, the oscillation frequency f0 can generally be expressed as Formula 1 below. It should be noted that the capacitance value of the capacitor C and the resistance value of the resistor R are represented by the same symbols C, R, respectively.

$$f0=1/(2.2 \times C \times R) \tag{1}$$

In the present embodiment, a resistor having a negative temperature characteristic is used as the resistor R. For example, a polysilicon resistor or the like is used as the resistor R. Since the polysilicon resistor has a negative temperature characteristic, the resistance value of the resistor R lowers as the temperature rises. Therefore, the oscillation frequency f0=1/(2.2×C×R) rises as the temperature rises. In other words, the oscillation frequency f0 with the influence of the signal delay of the circuits such as the NAND circuit eliminated has a positive temperature characteristic.

Further, the threshold voltage of the MOS transistors constituting the NAND circuit NA and the inverter circuits IV1, IV2 has a negative temperature characteristic, and the threshold voltage lowers as the temperature rises. If the threshold voltage lowers, the delay time of the signal in each of the circuits including the NAND circuit and so on shortens, and the oscillation frequency of the CR oscillator circuit 170 rises. For example, assuming that the load capacitance of each of the circuits is CL, the drain current is ID, the power supply voltage is VDOS, and a predetermined coefficient is k, the delay time in each of the circuits can be expressed as Formula 2 below.

$$td=k\{(CL \times VDOS)/ID\} \tag{2}$$

According to Formula 2, if the threshold voltage lowers as the temperature rises, the delay time td shortens due to the increase in the drain current ID, and thus, the oscillation frequency of the case in which the power supply voltage VDOS is fixed rises.

Figure 2:
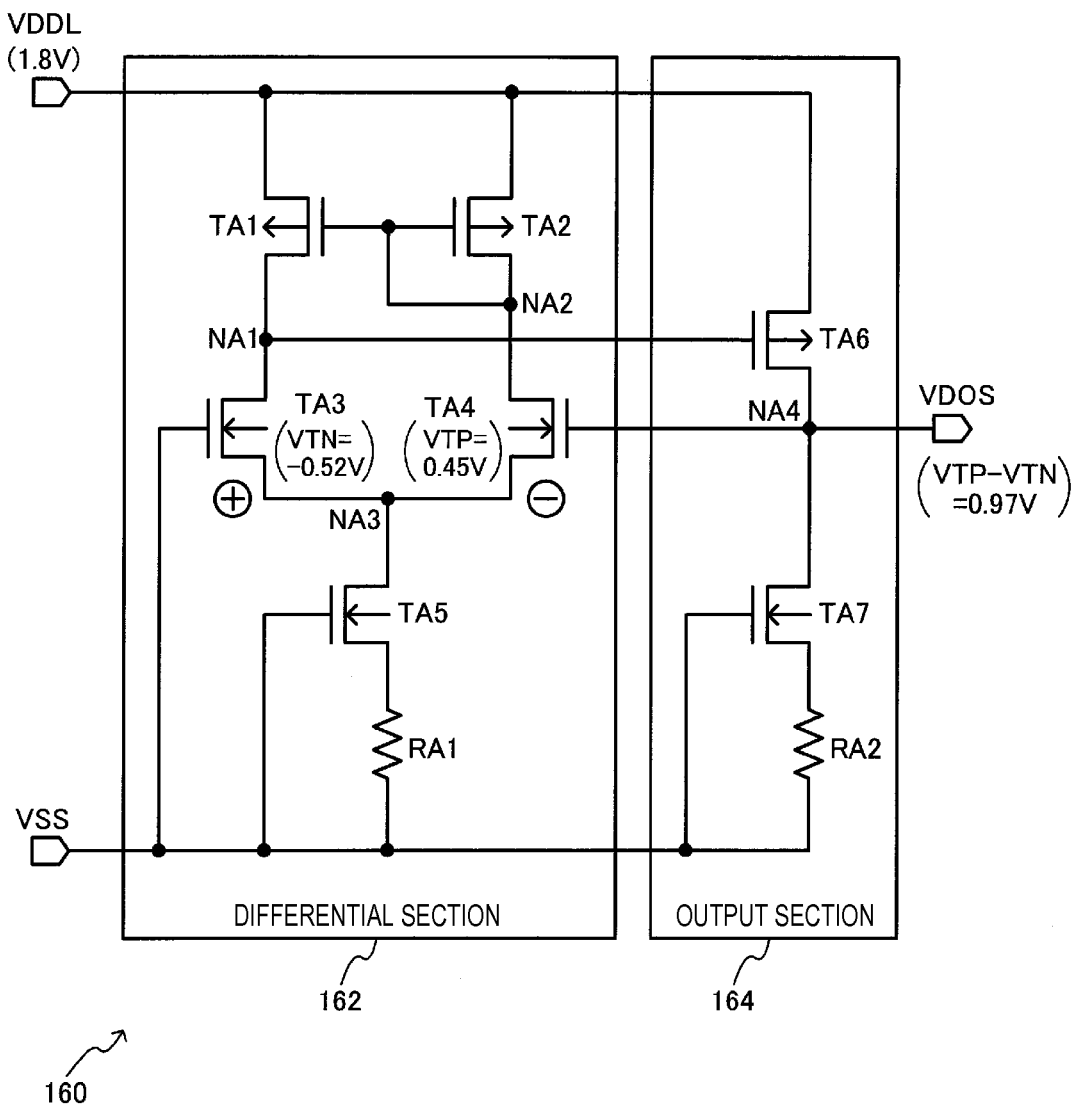
FIG. 2 is a diagram showing a detailed configuration example of a voltage generation circuit.

FIG. 2 shows a detailed configuration example of the voltage generation circuit 160. The voltage generation circuit 160 includes a differential section 162 and an output section 164. Then, the voltage generation circuit 160 operates in response to supply of the power supply voltage VDDL (e.g., 1.8 V) on the high-potential side and the power supply voltage VSS (e.g., 0 V) on the low-potential side.

The differential section 162 includes transistors TA1, TA2 constituting a current mirror circuit, transistors TA3, TA4 constituting a differential pair, and a transistor TA5 and a resistor element RA1 constituting a current source. The transistors TA1, TA2 are each, for example, a P-type transistor (a first conductive type transistor in a broad sense), and the transistors TA3, TA4, and TA5 are each an N-type transistor (a second conductive type transistor in a broad sense). Further, the transistors TA1, TA2, and TA4 are each an enhancement type transistor, and the transistors TA3, TA5 are each a depression type transistor.

The transistors TA1, TA2 are disposed between a node of the power supply voltage VDDL (a first power supply voltage) and nodes NA1, NA2, respectively. The source of each of the transistors TA1, TA2 is supplied with the power supply voltage VDDL, and the gate electrodes of the transistors TA1, TA2 are connected to the node NA2 of the drain of the transistor TA2.

The transistor TA3, TA4 are disposed between the nodes NA1, NA2 and a node NA3, respectively. The power supply voltage VSS is input to the gate electrode of the transistor TA3. The gate electrode of the transistor TA4 is connected to an output node NA4 of the voltage generation circuit 160.

The transistor TA5 and the resistor element RA1 are disposed in series between the node NA3 and a node of the power supply voltage VSS to constitute a current source. The power supply voltage VSS is input to the gate electrode of the transistor TA5, and one end of the resistor element RA1 is connected to the source of the transistor TA5. The other end of the resistor element RA1 is connected to a node of the power supply voltage VSS.

The output section 164 includes a transistor TA6 for driving, a transistor TA7, and a resistor element RA2. The transistor TA6 is an enhancement type P-type transistor, and the transistor TA7 is a depression type N-type transistor. The transistor TA6 is disposed between a node of the power supply voltage VDDL and the output node NA4, and the output node NA1 of the differential section 162 is connected to the gate electrode of the transistor TA6. The transistor TA7 and the resistor element RA2 are disposed in series between the output node NA4 and a node of the power supply voltage VSS to constitute a current source. The power supply voltage VSS is input to the gate electrode of the transistor TA7.

The transistor TA3 is formed as a transistor different in conductivity of the gate electrode from the transistor TA4. For example, it is arranged that the gate electrode of the transistor TA3 is the N type, and the gate electrode of the transistor TA4 is the P type. For example, the transistors TA3 and TA4 are equal in impurity concentration of the substrate and impurity concentration of the channel, but are different in conductivity of the gate electrode from each other, and are further different in impurity concentration of the gate electrode from each other.

Specifically, the threshold voltage of a MOS transistor can be expressed as follows.

$$Vth = \phi_{MS} - Q_{SS}/C_{OX} + 2\phi_F + Q_D/C_{OX}$$

Here, $\phi_{MS}$ denotes a work function difference between the gate electrode and the substrate, $Q_{SS}$ denotes a fixed charge in an oxide film, $C_{OX}$ denotes a capacitance per unit area of the gate oxide film, $\phi_F$ denotes a Fermi level, and $Q_D$ denotes a charge in a depletion layer. By setting the impurity concentration of the N-type gate electrode of the transistor TA3 and the impurity concentration of the P-type gate electrode of the transistor TA4, the threshold voltage VTN of the depression type transistor TA3 is set to, for example, −0.52 V, and the threshold voltage VTP of the enhancement type transistor TA4 is set to, for example, 0.45 V. Therefore, it becomes that the power supply voltage VDOS of VTP−VTN=0.97 V is output to the output node NA4 of the voltage generation circuit 160. In other words, it becomes possible to supply the power supply voltage VDOS of a constant voltage even in the case in which the power supply voltage VDDL varies.

Further, in FIG. 2, since the transistors TA5, TA7 are each a depression type transistor, the current source for making a bias current flow through the differential section 162 and the output section 164 can be realized without additionally disposing a bias current generation circuit.

It should be noted that the voltage generation circuit 160 is not limited to the configuration shown in FIG. 2, but various practical modifications such as elimination of some of the constituents or addition of other constituents are possible. For example, it is sufficient for the voltage generation circuit 160 to be a circuit having a first transistor (TA3), and a second transistor (TA4) different in conductivity of the gate electrode from the first transistor, and capable of supplying a voltage having a negative temperature characteristic corresponding to the work function difference voltage between the first transistor and the second transistor.

Figure 3A:
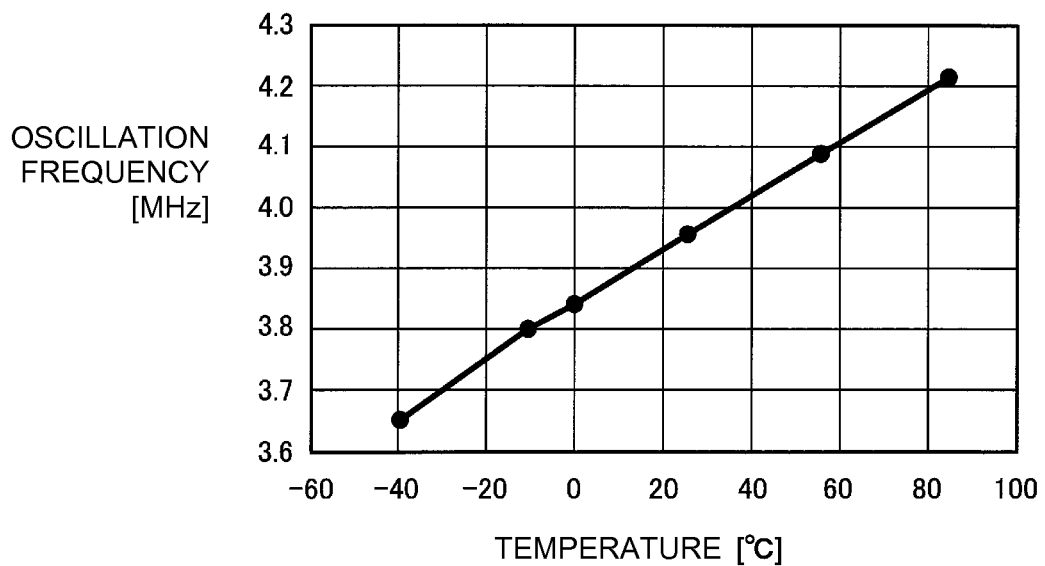
FIG. 3A is a diagram showing the temperature characteristic of an oscillation frequency when fixing a power supply voltage.

FIG. 3A is a diagram showing a simulation result of the temperature characteristic of the oscillation frequency in the case in which the power supply voltage VDOS is fixed. As described above, when the temperature rises, the resistance value of the resistor R lowers to raise $f0=1/(2.2 \times C \times R)$, and at the same time, the delay time td of the circuits such as the NAND circuit shortens. Therefore, as shown in FIG. 3A, the oscillation frequency of the CR oscillator circuit 170 in the case in which the power supply voltage VDOS is fixed rises as the temperature rises, and has a positive temperature characteristic.

Figure 3B:
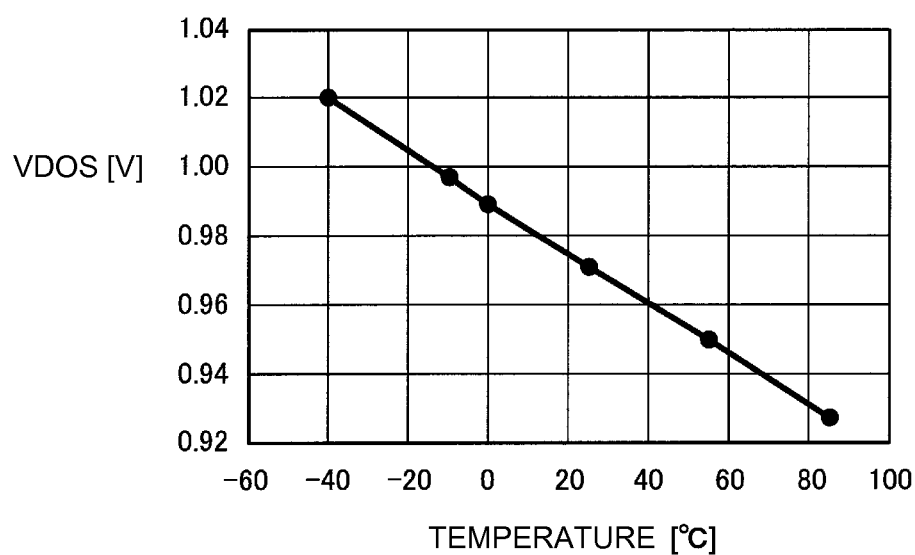
FIG. 3B is a diagram showing the temperature characteristic of the power supply voltage generated by the power supply voltage generation circuit.

FIG. 3B is a diagram showing a simulation result of the temperature characteristic of the power supply voltage VDOS. As described above, in the present embodiment, the voltage generation circuit 160 generates the power supply voltage VDOS having a negative temperature characteristic based on the work function difference between the transistors. Therefore, as shown in FIG. 3B, the power supply voltage VDOS lowers as the temperature rises, and has a negative temperature characteristic.

Figure 4:
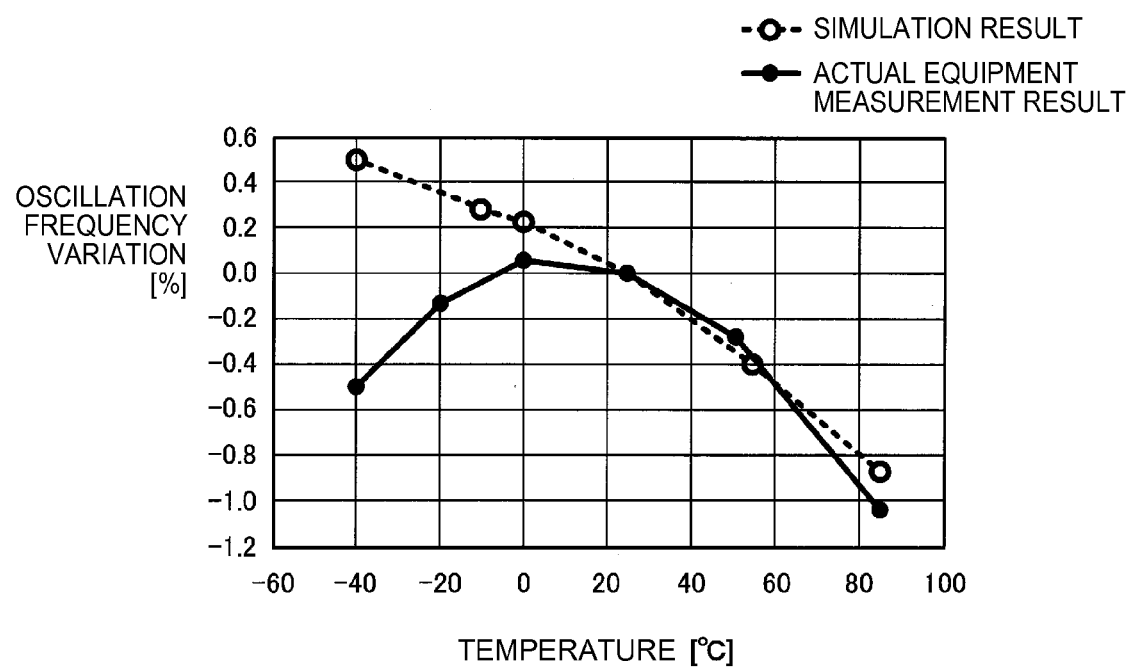
FIG. 4 is a diagram showing the temperature characteristic of the variation of the oscillation frequency.

FIG. 4 is a diagram showing a simulation result and an actual equipment measurement result of a variation of the oscillation frequency of the clock signal generation circuit.

In the present embodiment, the power supply voltage VDOS having such a negative temperature characteristic as shown in FIG. 3B is supplied to the CR oscillator circuit 170 an oscillation frequency of which has a positive temperature characteristic in the case in which the power supply voltage VDOS is fixed as shown in FIG. 3A. By adopting such a configuration, it becomes possible to cancel out the positive temperature characteristic (FIG. 3A) provided to the oscillation frequency of the CR oscillator circuit 170 alone with the negative temperature characteristic (FIG. 3B) of the power supply voltage VDOS. Thus, as shown in FIG. 4, the variation of the oscillation frequency to the temperature variation can be suppressed to a low level, and it becomes possible to suppress the variation to, for example, a level equal to or lower than roughly 2%. As described above, according to the present embodiment, an appropriate temperature compensation of the oscillation frequency becomes possible, and it becomes possible to supply the clock signal CLK low in frequency variation to the temperature variation.

For example, in the related art described above, it is necessary to separately dispose other circuit elements such as an operational amplifier in addition to the reference voltage generation circuit and the amplifier circuit of the oscillator circuit in order to realize the temperature compensation of the oscillation frequency. Therefore, there is a problem that the increase in power consumption and circuit size is incurred.

In contrast, in the present embodiment, the temperature compensation of the oscillation frequency can be realized only by disposing the voltage generation circuit 160 for supplying the CR oscillator circuit 170 with the power supply voltage VDOS having such a negative temperature characteristic as shown in FIG. 3B. Therefore, it becomes possible to realize the temperature compensation of the oscillation frequency while suppressing the increase in current consumption and circuit size compared to the related art.

Specifically, a typical temperature compensation is realized by combining circuit elements having respective temperature characteristics different in polarity from each other. In contrast, in the present embodiment, focusing attention on the fact that the oscillation frequency of the CR oscillator circuit 170 when fixing the power supply voltage has such a positive temperature characteristic as shown in FIG. 3A, the power supply voltage VDOS having such a negative temperature characteristic as to cancel out the positive temperature characteristic is supplied to the CR oscillator circuit 170. Since the power supply voltage VDOS having such a negative temperature characteristic can be generated by a simple circuit configuration having a small circuit size using the work function difference between the transistors, the increase in the circuit size can be kept to the minimum. Further, by using the work function difference, the variation in oscillation frequency to the power supply voltage variation can also be suppressed to a low level. In other words, also in the case in which the power supply voltage VDDL varies in FIG. 2, the variation in the power supply voltage VDOS based on the work function difference can be minimized. Therefore, if the positive temperature characteristic of the CR oscillator circuit 170 is canceled out by supplying the power supply voltage VDOS having the negative temperature characteristic based on such a work function difference, it becomes possible to keep not only the variation in oscillation frequency to the temperature variation, but also the variation in the oscillation frequency to the power supply voltage variation, to the minimum.

Further, the CR oscillator circuit 170 has an advantage that the start-up time is short compared to the oscillator circuit using an oscillator such as a crystal, and a stable and high-speed clock signal can promptly be supplied. Therefore, by using the clock signal generated by the CR oscillator circuit 170 as the clock signal for an operation of the detection device such as a gyro sensor described later, speeding-up of start-up and the operation of the detection device can be realized.

However, in the normal CR oscillator circuit 170, the oscillation frequency significantly varies with respect to the temperature variation as shown in FIG. 3A. Therefore, if the clock signal generated by the CR oscillator circuit 170 is used directly as the clock signal for the operation of the detection device such as a gyro sensor, there is a possibility that the performance of the detection device degrades due to the frequency variation of the clock signal.

In this regard, according to the clock signal generation circuit of the present embodiment, since the positive temperature characteristic of the CR oscillator circuit 170 is canceled out by supplying the power supply voltage VDOS having a negative temperature characteristic, and thus the temperature compensation of the oscillation frequency is performed, the performance of the detection device can be maintained. Therefore, according to the present embodiment, both of the speeding-up of the operation and the start-up of the detection device, and the maintenance of the performance of the detection device can be realized.

2. CR Oscillator Circuit

Figure 5:
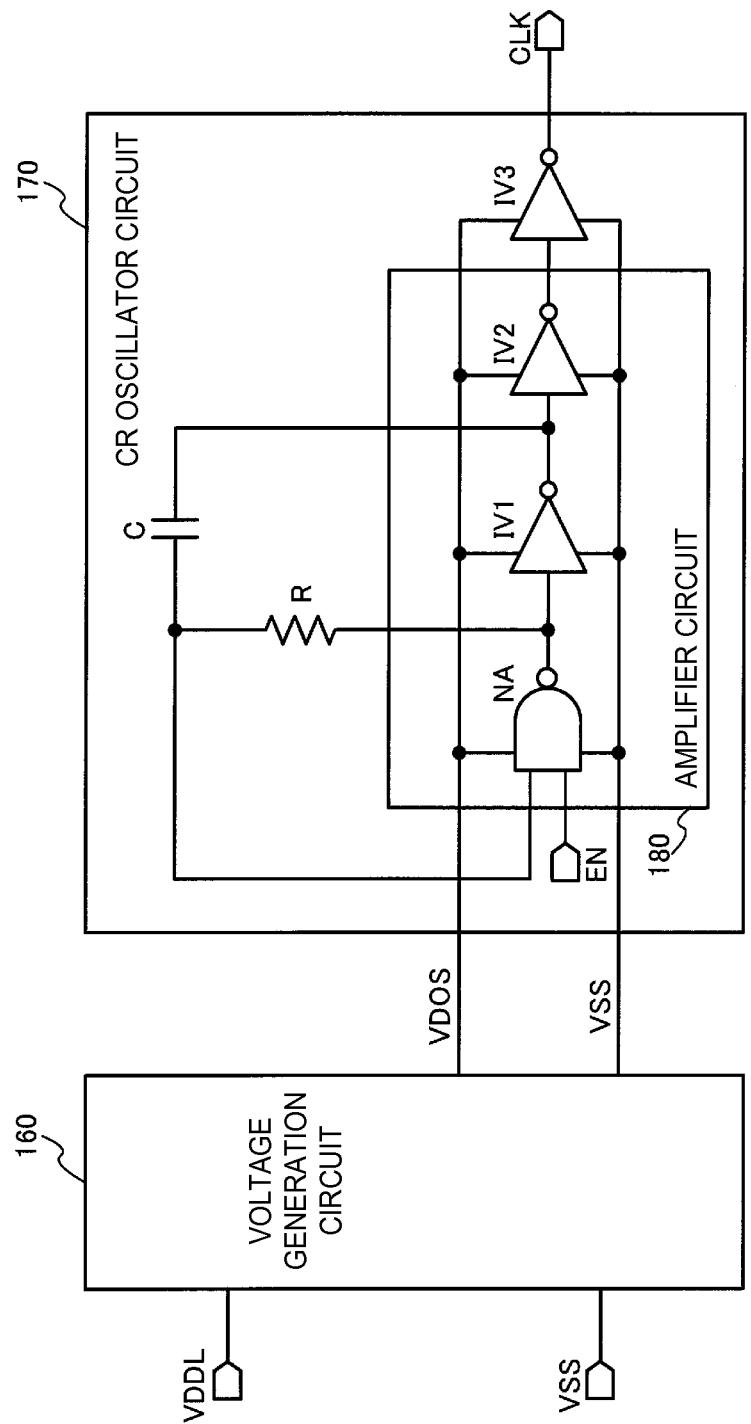
FIG. 5 is a diagram showing another configuration example of a CR oscillator circuit.

FIG. 5 shows another configuration example of the CR oscillator circuit 170. In FIG. 5, a connection configuration of the resistor R and so on is different from that of the configuration shown in FIG. 1. Specifically, although in FIG. 1, there is adopted a connection configuration in which the output of the inverter circuit IV2 is fed back to the input of the amplifier circuit 180 via the resistor R, in FIG. 5, there is adopted a connection configuration in which the output of the NAND circuit NA is fed back to the input of the amplifier circuit 180 via the resistor R. As described above, as the connection configuration of the resistor R and the capacitor C, a variety of practical modifications can be adopted. Further, a variety of practical modifications can also be adopted as the configuration of the buffer circuit 180, and it is also possible to change the number of stages of the inverter circuits, or to adopt other circuits such as an inverter circuit or a NOR circuit instead of the NAND circuit.

Figure 6:
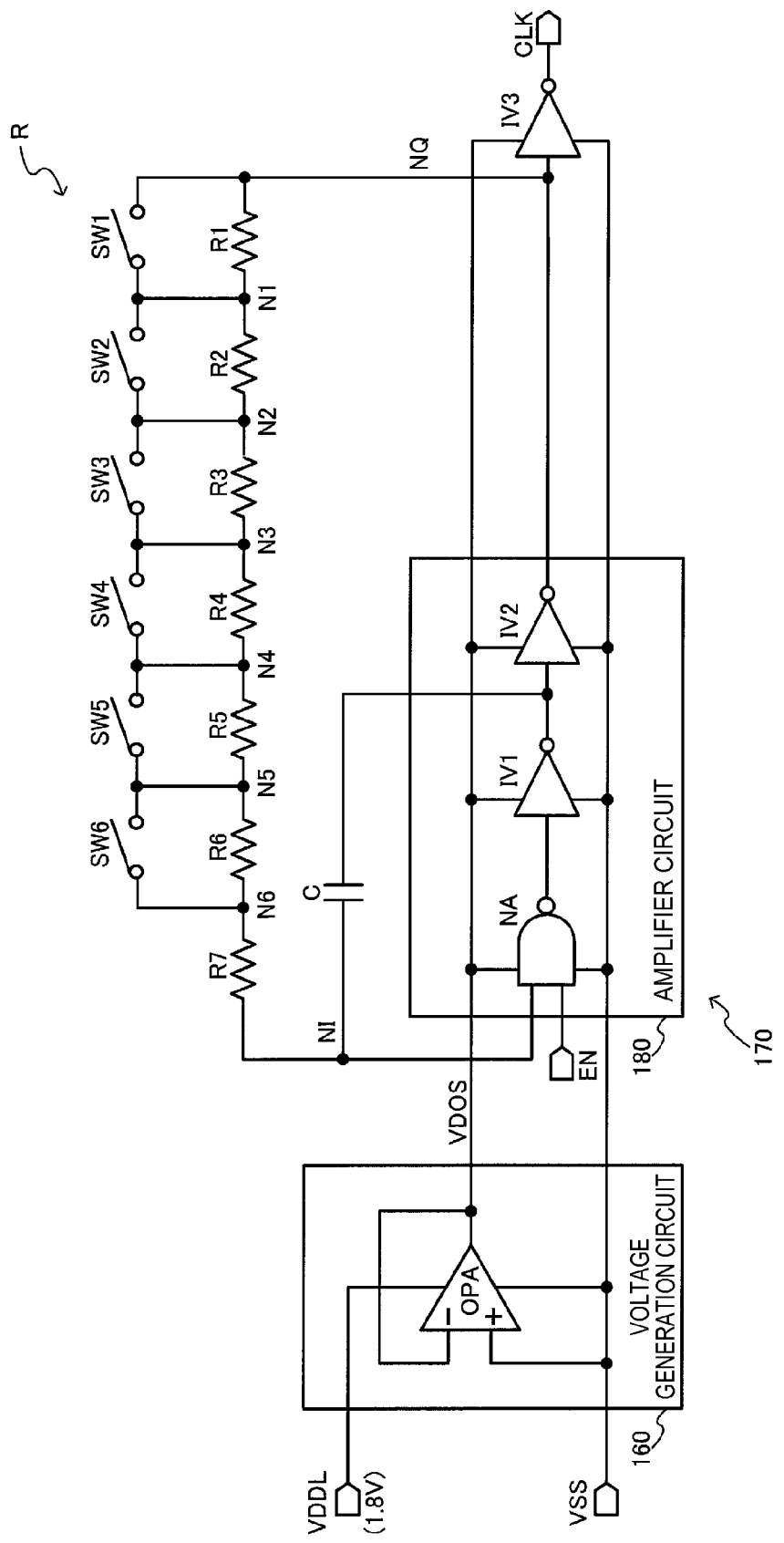
FIG. 6 is a diagram showing another configuration example of the CR oscillator circuit.

FIG. 6 shows still another configuration example of the CR oscillator circuit 170. In FIG. 6, the resistor R (a resistance circuit) includes a plurality of resistor elements R1 through R6 and a reference resistor element R7 connected in series to each other. Further, the resistor R includes a plurality of switches SW1 through SW6 connected in series to each other. The resistor elements R1 through R6 and the reference resistor element R7 are connected in series between an output node NQ and an input node NI of the amplifier circuit 180. The switches SW1 through SW6 are connected in series between the output node NQ and a node N6. The switches SW1 through SW6 are disposed in parallel to the resistor elements R1 through R6, respectively. The switches SW1 through SW6 can each be realized by, for example, a MOS transistor (e.g., a transfer gate), or by fuse element or the like described later.

According to the configuration shown in FIG. 6, by setting ON/OFF of each of the switches SW1 through SW6, the resistance value of the resistor R can variably be set. For example, if all of the switches SW1 through SW6 are set to the OFF state, the resistance value of the resistor R becomes R1+R2+R3+R4+R5+R6+R7. In contrast, if all of the switches SW1 through SW6 are set to the ON state, the resistance value of the resistor R becomes R7. It should be noted that in the present embodiment, the resistor element and the resistance value are denoted by the same symbol for the sake of simplification of the explanation.

The resistance values of the resistor elements R1 through R6 are weighted in a binary manner. For example, the resistor elements R1 through R6 are each formed of one or more unit resistors. For example, the resistor element R1 is formed of $2^0=1$ resistor unit, the resistor element R2 is formed of $2^1=2$ resistor units connected in series to each other, and the resistor element R3 is formed of $2^2$ resistor units connected in series to each other. Similarly, the resistor elements R4, R5, and R6 are formed of $2^3$, $2^4$, and $2^5$ resistor units connected in series to each other, respectively. Therefore, assuming that the resistance value of the unit resistor is RU, the resistance value of the resistor element R1 is set to $2^0 \times RU$ (=RU), the resistance value of the resistor element R2 is set to $2^1 \times RU$ (=2×RU), the resistance value of the resistor element R3 is set to $2^2 \times RU$, the resistance value of the resistor element R4 is set to $2^3 \times RU$, the resistance value of the resistor element R5 is set to $2^4 \times RU$, and the resistance value of the resistor element R6 is set to $2^5 \times RU$.

It should be noted that the resistor element R7 is the reference resistor element for setting the oscillation frequency to be the reference, and assuming that the reference resistance value as the resistance value of the resistor element R7 is RB, the reference resistance value RB can be set to, for example, a resistance value roughly equal to R6. By setting the reference resistance value RB as described above, it becomes possible to variably set the resistance value of the resistor R within a predetermined range (e.g., a range of RB through $RB+RU \times (2^6-1)$). It should be noted that the setting method of the resistance value is not limited to such a method as described above, but a variety of practical modifications can be adopted.

3. Adjustment of Oscillation Frequency

Figure 7A:
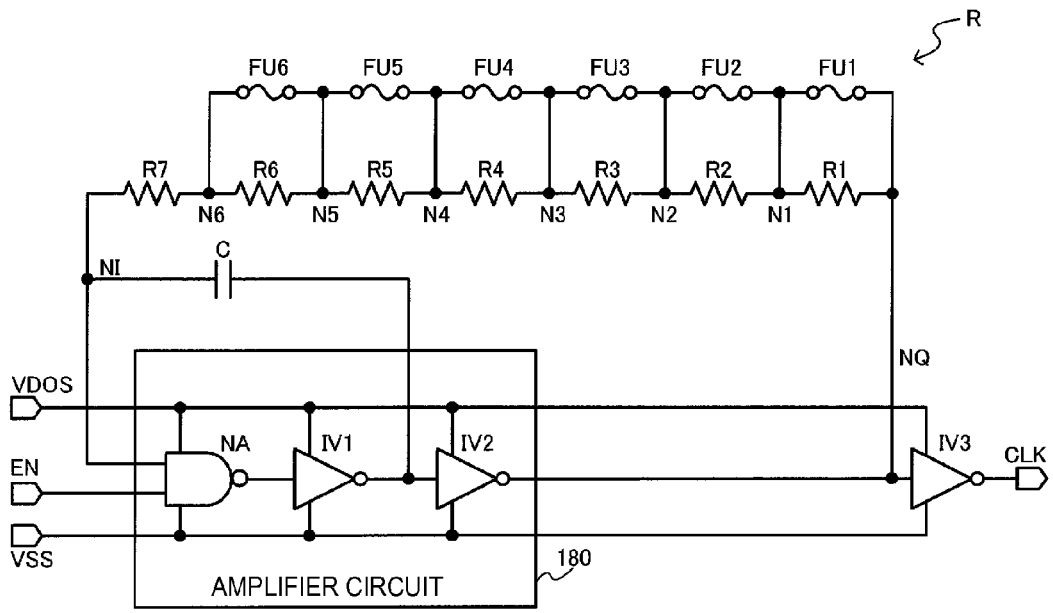
FIGS. 7A and 7B are explanatory diagrams of an adjustment method of the oscillation frequency by fuse cutting.
Figure 7B:
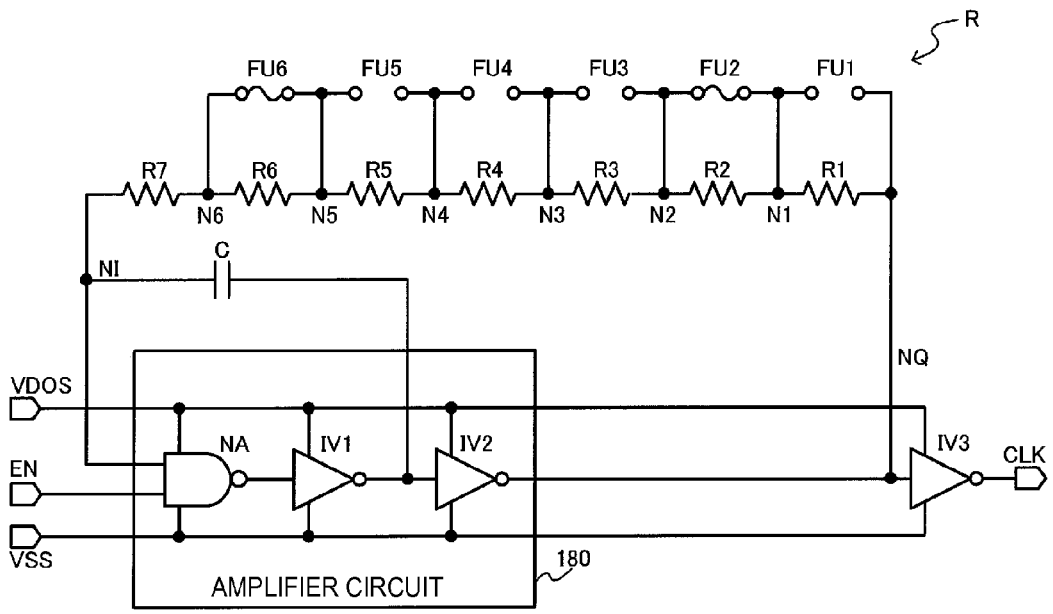

Then, an example of an adjustment method of the oscillation frequency according to the present embodiment will be explained. FIGS. 7A and 7B are diagrams for explaining a method of adjusting the oscillation frequency by fuse cutting.

In FIGS. 7A and 7B, fuse elements FU1 through FU6 are disposed as the switch elements SW1 through SW6 shown in FIG. 6. In other words, the resistor R includes the plurality of resistor elements R1 through R6, and the reference resistor element R7 connected in series to each other, and the plurality of fuse elements FU1 through FU6 disposed in parallel to the respective resistor elements R1 through R6. For example, the resistor element R1 and the fuse element FU1 are connected in parallel to each other between the output node NQ of the amplifier circuit 180 and a node N1, and the resistor element R2 and the fuse element FU2 are connected in parallel to each other between the node N1 and a node N2. The connection configurations of the resistor elements R3 through R6 and the respective fuse elements FU3 through FU6 are the same as described above. The resistance values of the resistor elements R1 through R6 are weighted in a binary manner, and as described above, the resistance value of the resistor element R1 is set to $2^0 \times RU$, the resistance value of the resistor element R2 is set to $2^1 \times RU$, the resistance value of the resistor element R3 is set to $2^2 \times RU$, ..., and the resistance value of the resistor element R6 is set to $2^5 \times RU$.

Further, the reference resistor element R7 is for setting the reference frequency as described above, and the resistance value becomes the reference resistance value RB. The reference resistor element R7 is disposed between the node N6 of one end of the resistor element R6, and an input node NI of the amplifier circuit 180.

Before cutting the fuse, all of the fuse elements FU1 through FU6 are in a non-cutting state as shown in FIG. 7A. Therefore, the resistance value of the resistor R is set to the reference resistance value RB of the reference resistor element R7 (to be precise, RB+(parasitic resistance value of the fuse elements and so on)). For example, assuming that the oscillation frequency of the target is 4 MHz, the reference resistance value RB is set so that the oscillation frequency becomes 6 MHz in the case in which the conditions of the manufacturing process and the temperature are in typical conditions before cutting the fuse shown in FIG. 7A. Then, in this state, the oscillation frequency of the CR oscillator circuit 170 is measured. Assuming that the oscillation frequency thus measured is fr, a fuse value is calculated by a trimming formula expressed by a linear expression of fr as shown in, for example, Formula 3 below. It should be noted that the symbols a and b are constants.

(fuse value)=$a \times fr+b$ (3)

What of the fuse elements FU1 through FU6 should be cut (trimmed) is determined based on the fuse value thus calculated. For example, in FIG. 7B, the fuse elements FU1, FU3, FU4, and FU5 are cut based on the fuse value calculated by the trimming formula. In this case, the resistance value of the resistor R becomes RB+R1+R3+R4+R5 (+(parasitic resistance value)).

Specifically, by converting the fuse value (the fuse value after being converted into an integer) into binary expression data, the fuse elements to be cut can be determined. For example, if the fuse value is equal to 1)(=$2^0$), the fuse element FU1 is cut, and if the fuse value is equal to 2 (=$2^1$), the fuse element FU2 is cut. Further, the fuse value is equal to 3 (=$2^0+2^1$), the fuse elements FU1, FU2 are cut, if the fuse value is equal to 4 (=$2^2$), the fuse element FU3 is cut, and if the fuse value is equal to 5 (=$2^0+2^2$), the fuse element FU1 and FU3 are cut. In other words, the fuse FU1 corresponds to the LSB of the fuse value in the binary expression, the fuse FU2 corresponds to the next bit of the LSB, and the fuse FU3 corresponds to the next bit thereof. Similarly, the fuse FU6 corresponds to the MSB of the fuse value in the binary expression. Further, if the LSB of the fuse value is 1, the fuse FU1 is cut, but if it is 0, the fuse FU1 is not cut. If the next bit of the LSB is 1, the fuse FU2 is cut, but if it is 0, the fuse FU2 is not cut.

Figure 8:
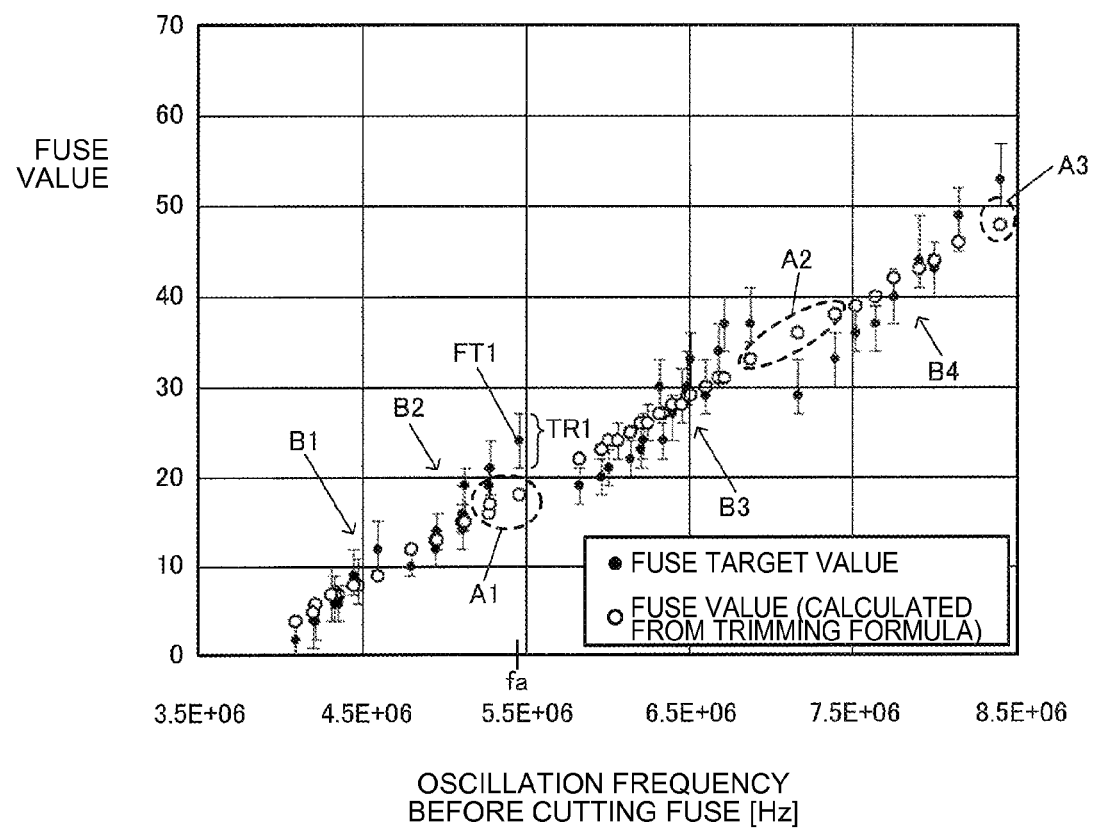
FIG. 8 is a diagram showing a relationship between the oscillation frequency before cutting the fuse, and a fuse target value and a fuse value.

FIG. 8 is a diagram showing a relationship between the oscillation frequency fr measured before cutting the fuse, and the fuse target value and the fuse value calculated by the trimming formula (Formula 3).

For example, FIG. 8 shows the case of performing a simulation while varying the process condition to obtain a fuse target value (a target value of the fuse value) for setting the oscillation frequency to the target frequency (e.g., 4 MHz). The symbol FT1 (a filled circle) shown in FIG. 8 represents the fuse target value in the case in which the oscillation frequency (FIG. 7A) before cutting the fuse (fr) is equal to fa. Further, the symbol TR1 shown in FIG. 8 indicates a fuse target range set with respect to the fuse target value FT1. In the case in which the target frequency is, for example, 4 MHz, the fuse target range TR1 is set with respect to the range where the oscillation frequency becomes, for example, 4 MHz±5%. In other words, in the case in which the oscillation frequency fr before cutting the fuse is equal to fa in a specific process condition, if the fuse value falls within the fuse target range TR1, it results that the oscillation frequency falls within the range of 4 MHz±5%.

As indicated by the symbols B1, B2, B3, and B4 shown in FIG. 8, the fuse target value varies in accordance with the process condition.

For example, the symbol B1 shown in FIG. 8 is the fuse target value corresponding to the process condition that the threshold voltage of the transistor of the amplifier circuit 180 is high, and the resistance value of the resistor R and the capacitance value of the capacitor C are high. In other words, the symbol B1 is a simulation result of the fuse target value performed on the present process condition. In this case, the oscillation frequency fr before cutting the fuse is set to a low frequency, and the fuse value for setting the oscillation frequency to the target frequency becomes a small value. Therefore, by cutting the fuse with the setting (in which the number of fuse elements to be cut is small) in which the fuse value takes a small value, it is possible to approximate the oscillation frequency to the target frequency.

In contrast, the symbol B4 shown in FIG. 8 is the fuse target value corresponding to the process condition that the threshold voltage of the transistor of the amplifier circuit 180 is low, and the resistance value of the resistor R and the capacitance value of the capacitor C are low. In this case, the oscillation frequency fr before cutting the fuse is set to a high frequency, and the fuse value for setting the oscillation frequency to the target frequency becomes a great value. Therefore, by cutting the fuse with the setting (in which the number of fuse elements to be cut is large) in which the fuse value takes a great value, it is possible to approximate the oscillation frequency to the target frequency.

Further, the coefficients a, b of the trimming formula of the fuse value expressed by Formula 3 above can be set based on the simulation result of the fuse target value shown in FIG. 8.

However, as indicated by the symbols A1, A2 shown in FIG. 8, the fuse value obtained from the trimming formula runs off the fuse target range (±5% of the target frequency) in some cases. For example, the fuse value (the open circle) in the case in which the oscillation frequency fr before cutting the fuse is equal to fa is located out of the fuse target range TR1 (4 MHz±5%) of the fuse target value FT1 (the filled circle). This is because the trimming formula expressed as Formula 3 above is a linear expression of fr, and as indicated by the symbols B1, B2, B3, and B4 shown in FIG. 8, the fuse target values in the case of varying the process condition cannot accurately be fitted by such a trimming formula using the linear expression. In other words, this is because the values of the intercepts of the linear expressions corresponding to the respective process conditions of B1, B2, B3, and B4 are values different between the process conditions due to the variation in the threshold voltage of the transistor and so on.

Therefore, in the method of obtaining the fuse value based on the oscillation frequency fr before cutting the fuse using the trimming formula expressed as Formula 3 above to determine the fuse elements to be cut based on the fuse value thus obtained, there is a problem that it is difficult to fit the oscillation frequency into a desired fuse target range (4 MHz±5%).

Figure 9A:
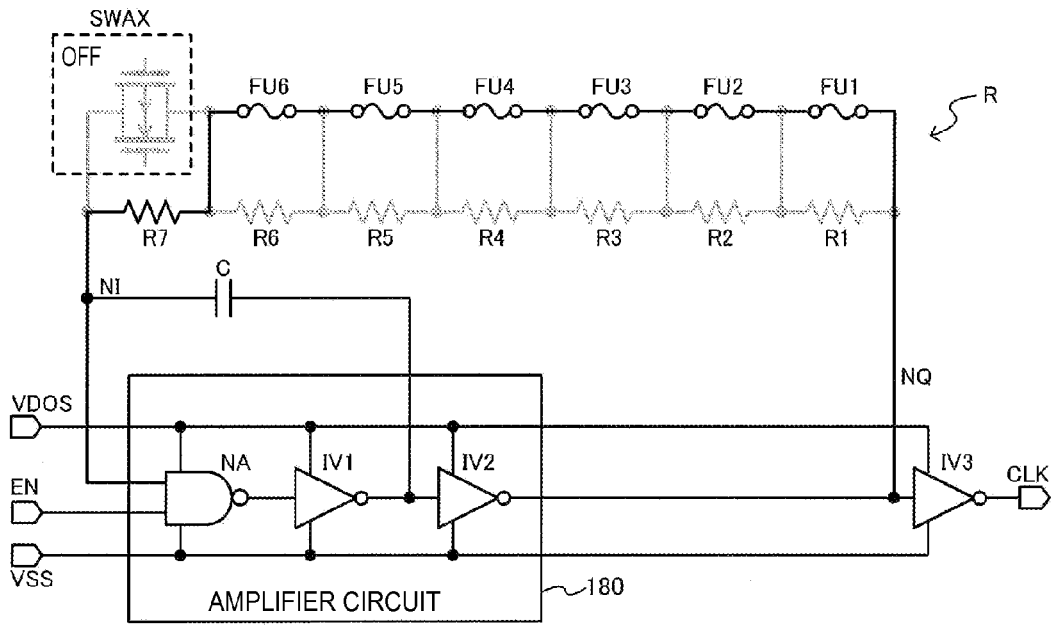
FIGS. 9A and 9B are explanatory diagrams of an adjustment method of the oscillation frequency using a trimming auxiliary switch.

In order to solve such a problem, in the present embodiment, there is disposed such a trimming auxiliary switch SWAX as shown in FIG. 9A. For example, in FIG. 9A, the resistor R includes the plurality of resistor elements R1 through R6, and the reference resistor element R7 connected in series to each other, and the plurality of fuse elements FU1 through FU6 disposed in parallel to the respective resistor elements R1 through R6. Further, the trimming auxiliary switch SWAX is disposed in parallel to the reference resistor element R7.

As shown in FIG. 9A, the trimming auxiliary switch SWAX is set to the OFF state in a first measurement mode of the oscillation frequency before cutting the fuse. Thus, there can be realized a state in which the reference resistor element R7 and the fuse elements FU1 through FU6 connected in series between the output node NQ and the input node NI.

Figure 9B:
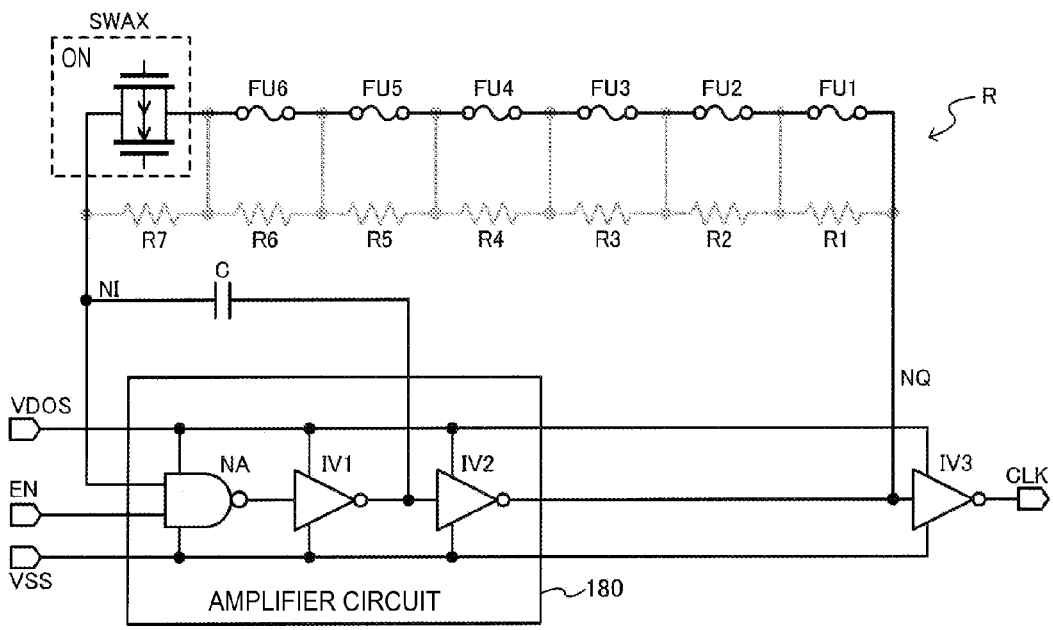

In contrast, as shown in FIG. 9B, the trimming auxiliary switch SWAX is set to the ON state in a second measurement mode of the oscillation frequency before cutting the fuse. Thus, there can be realized a state in which the fuse elements FU1 through FU6 and the trimming auxiliary switch SWAX connected in series between the output node NQ and the input node NI.

For example, it is assumed that the oscillation frequency in the first measurement mode (FIG. 9A) before cutting the fuse is fr1, and the oscillation frequency in the second measurement mode (FIG. 9B) before cutting the fuse is fr2. In this case, the fuse value is calculated using the trimming formula of Formula 4 below expressed as the linear expression of fr1 and fr2. It should be noted that the symbols c, d, and e are constants.

$$(\text{fuse value}) = c \times fr1 + d \times fr2 + e \quad (4)$$

Figure 10:
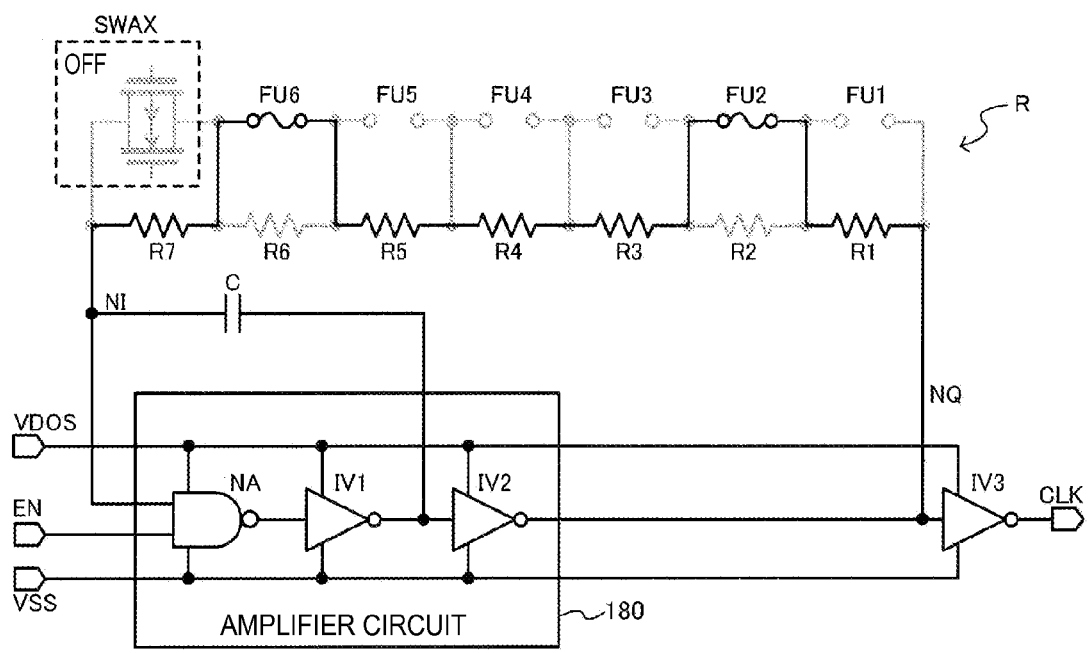
FIG. 10 is an explanatory diagram of the adjustment method of the oscillation frequency using the trimming auxiliary switch.

The fuse is cut as shown in FIG. 10 based on the fuse value calculated by the trimming formula of Formula 4 above. In FIG. 10, the fuse elements FU1, FU3, and FU5 are cut.

According to the method of the present embodiment described hereinabove, as shown in FIGS. 9A and 9B, the oscillation frequencies fr1, fr2 before cutting the fuse can be measured in two states, namely the case in which the reference resistor element R7 is in a connected state, and the case in which the reference resistor element R7 is in an unconnected state. Therefore, as shown in FIG. 9B, the oscillation frequency fr2 determined by the threshold voltage of the transistor of the amplifier circuit 180 and the characteristic of the capacitance of the capacitor C can be measured. Thus, the variation in the fuse value caused by the variation in the threshold voltage of the transistor can appropriately be corrected. As a result, it becomes easy to make the oscillation frequency in the case of cutting the fuse elements based on the calculation value of the trimming formula fall within the target frequency range.

Figure 11:
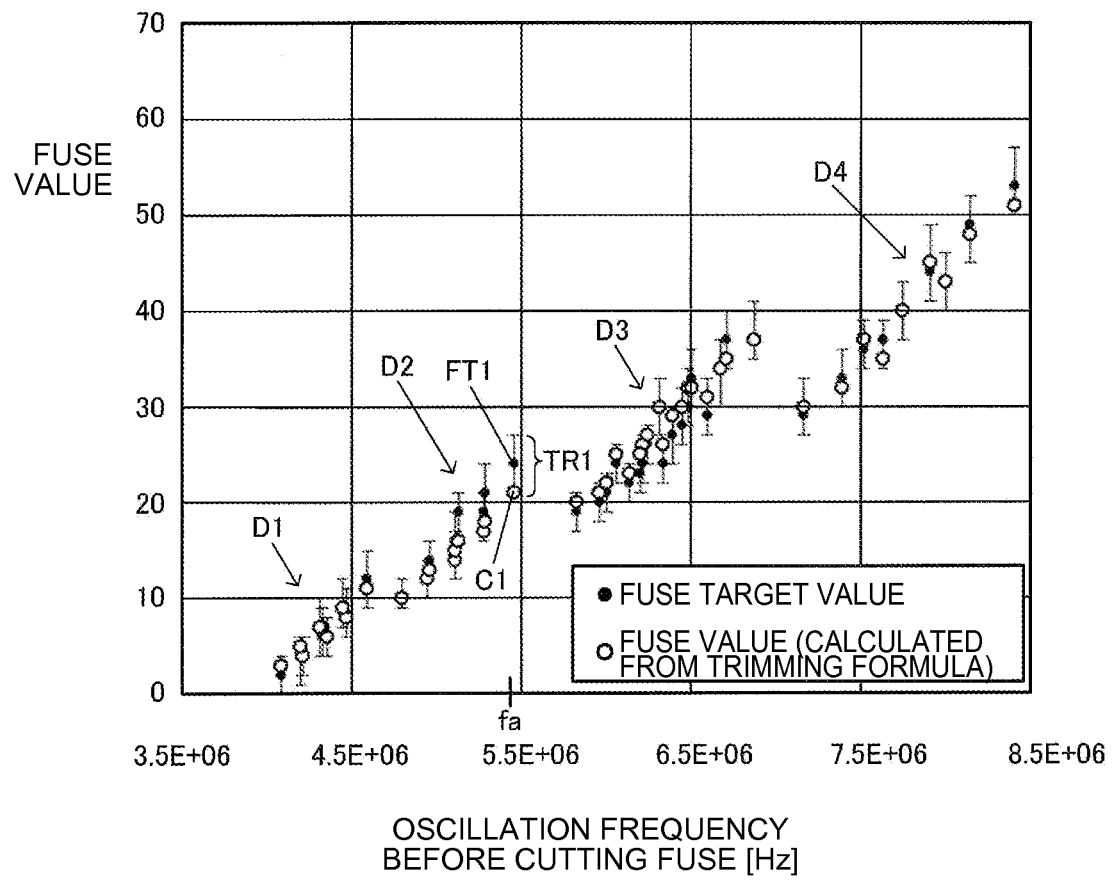
FIG. 11 is a diagram showing a relationship between the oscillation frequency before cutting fuse, and the fuse target value and the fuse value in the case of using the adjustment method according to the embodiment.

For example, FIG. 11 is a diagram showing a relationship between the oscillation frequency before cutting the fuse, and the fuse value in the case of using the adjustment method according to the embodiment. The fuse values shown in FIG. 11 are each a value calculated by the trimming formula of Formula 4 above.

For example, the fuse value corresponding to the oscillation frequency fa is located out of the fuse target range TR1 as indicated by the symbol A1 in FIG. 8, but falls within the fuse target range TR1 as indicated by the symbol C1 in FIG. 11. Therefore, according to the adjustment method of the present embodiment, by calculating the fuse value using the trimming formula of Formula 4 described above and then cutting the fuse based on the fuse value calculated, it becomes possible to make the oscillation frequency fall within the desired fuse target range (4 MHz±5%).

Therefore, according to the present embodiment, even in the case in which the values of the intercepts of the linear expressions corresponding to the respective process conditions of D1, D2, D3, and D4 shown in FIG. 11 are values different between the process conditions due to the variation in the threshold voltage of the transistor and so on, it is possible to calculate the fuse value closer to the fuse target value to cut the fuse. In other words, by using the trimming formula of Formula 4 described above, it becomes possible to fit the fuse value closer to the fuse target value, and it becomes possible to make the oscillation frequency fall within the desired fuse target range (4 MHz±5%). Therefore, the adjustment method of the oscillation frequency higher in accuracy can be realized.

4. Electronic Apparatus, Gyro Sensor

Figure 12:
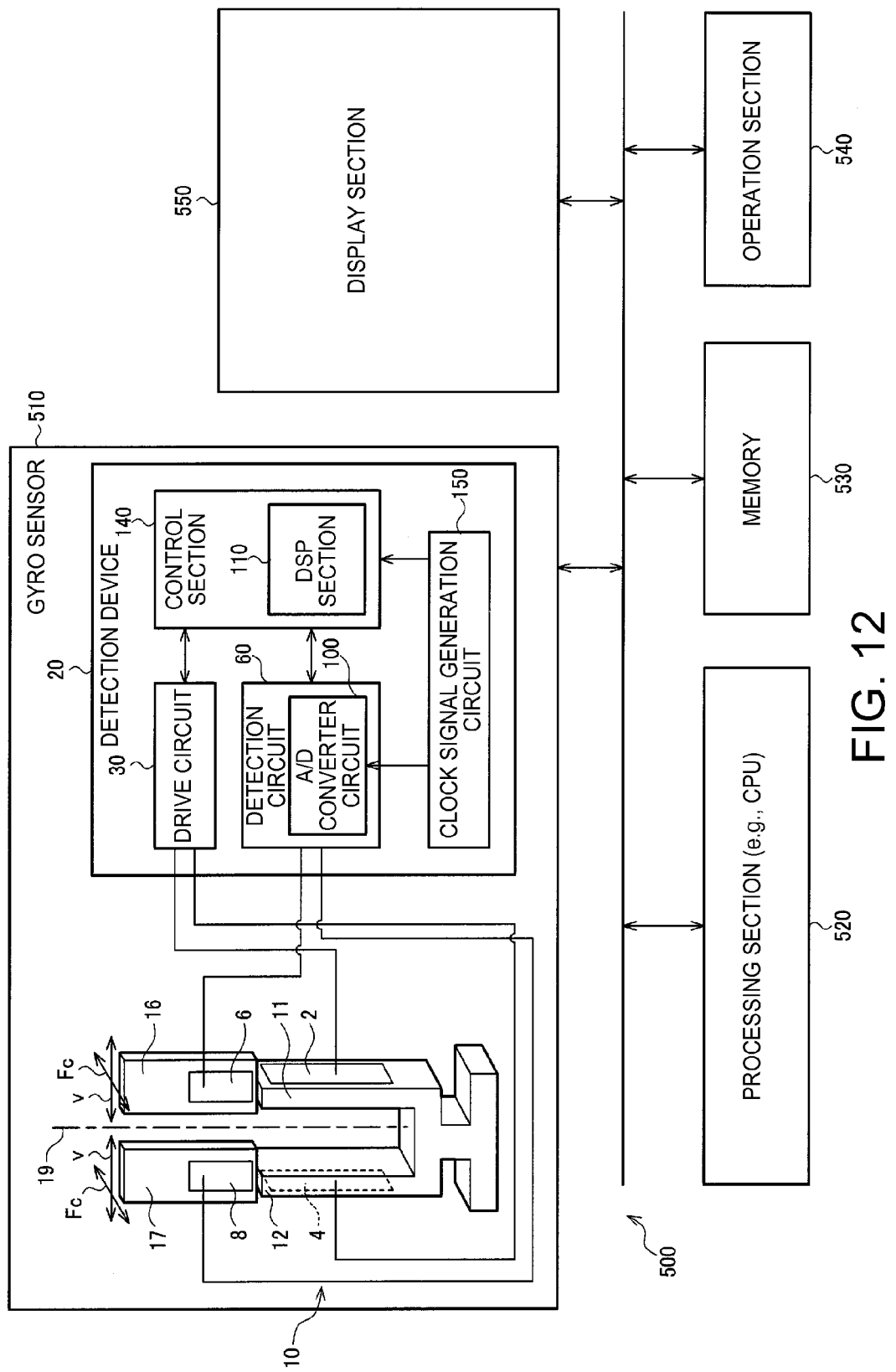
FIG. 12 is a diagram showing a configuration example of a detection device, an electronic apparatus, and a gyro sensor according to the embodiment.

FIG. 12 shows a configuration example of a detection device 20 including the clock signal generation circuit 150 according to the present embodiment, a gyro sensor 510 (a sensor in a broad sense) including the detection device 20, and an electronic apparatus 500 including the gyro sensor 510.

It should be noted that the detection device 20, the electronic apparatus 500, and the gyro sensor 510 are not limited to the configuration shown in FIG. 12, but various practical modifications such as elimination of some of the constituents or addition of other constituents are possible. Further, as the electronic apparatus 500 according to the present embodiment, there can be assumed a variety of equipment such as a digital camera, a video camera, a smartphone, a mobile phone, a car navigation system, a robot, a gaming machine, a timepiece, a health appliance, or a portable information terminal. Further, although the case in which a physical quantity transducer is a piezoelectric vibrator (a vibratory gyroscope), and the sensor is a gyro sensor will hereinafter be explained as an example, the invention is not limited to this example. The invention can also be applied to, for example, a vibrator (a vibratory gyroscope) of a capacitance detection type formed of a silicon substrate, and a physical quantity transducer and a sensor for detecting a physical quantity equivalent to angular velocity information or other physical quantities than the angular velocity information.

The electronic apparatus 500 includes the gyro sensor 510 and a processing section 520. Further, the electronic apparatus 500 can include a memory 530, an operation section 540, and a display section 550. The processing section 520 (e.g., a CPU and an MPU) performs control of the gyro sensor 510 and so on and overall control of the electronic apparatus 500. Further, the processing section 520 performs a process based on the angular velocity information (a physical quantity in a broad sense) detected by the gyro sensor 510. For example, the processing section 520 performs the process for image stabilization, posture control, and GPS autonomous navigation based on the angular velocity information. The memory device 530 (e.g., a ROM, a RAM) stores control programs and a variety of data, and further, functions as a working area and a data storage area. The operation section 540 is a device for the user to operate the electronic apparatus 500, and the display section 550 displays a variety of information to the user.

The gyro sensor 510 (the sensor) includes the vibrator 10 and the detection device 20. The vibrator 10 (a physical quantity transducer in a broad sense) shown in FIG. 12 is a tuning-fork piezoelectric vibrator formed of a thin plate made of a piezoelectric material such as quartz crystal, and includes driving vibrators 11, 12 and detecting vibrators 16, 17. The driving vibrators 11, 12 are provided with drive terminals 2, 4, and the detecting vibrators 16, 17 are provided with detection terminals 6, 8.

The detection device 20 includes a drive circuit 30, a detection circuit 60, a control section 140, and a clock signal generation circuit 150.

The drive circuit 30 outputs a drive signal (a drive voltage) to drive the vibrator 10. Then, the drive circuit 30 receives a feedback signal from the vibrator 10, and thus excites the vibrator 10. The detection circuit 60 receives a detection signal (a detection current, charge) from the vibrator 10 driven by the drive signal, and then detects (extracts) a desired signal (a Coriolis force signal), which corresponds to the physical quantity applied to the vibrator 10, from the detection signal.

Specifically, an alternating-current drive signal (the drive signal) from the drive circuit 30 is applied to the drive terminal 2 of the driving vibrator 11. Then, the driving vibrator 11 begins a vibration due to an inverse piezoelectric effect, and the driving vibrator 12 also begins a vibration due to a tuning-fork vibration. On this occasion, the current (the charge) generated by the piezoelectric effect of the driving vibrator 12 is fed back from the drive terminal 4 to the drive circuit 30 as a feedback signal. Thus, a vibration loop including the vibrator 10 is formed.

When the driving vibrators 11, 12 vibrate, the detecting vibrators 16, 17 vibrate at a vibration velocity v in the direction shown in FIG. 12. Then, a current (a charge) generated due to the piezoelectric effect of the detecting vibrators 16, 17 is output from the detection terminals 6, 8 as detection signals (first and second detection signals). Then, the detection circuit 60 receives the detection signals from the vibrator 10, and then detects a desired signal (a desired wave) as a signal corresponding to the Coriolis force. Specifically, when the vibrator 10 (the gyro sensor) rotates around a detection axis 19, a Coriolis force Fc generates in a direction perpendicular to the direction of the vibration at the vibration velocity v. For example, assuming that the angular velocity of the vibrator rotating around the detection axis 19 is ω, the mass of the vibrator is m, and the vibration velocity of the vibrator is v, the Coriolis force Fc is expressed as follows.

$$Fc=2m \cdot v \cdot \omega$$

Therefore, by the detection circuit 60 detecting the desired signal as a signal corresponding to the Coriolis force, the rotational angular velocity ω of the gyro sensor can be obtained. Further, by using the angular velocity ω thus obtained, it is possible for the processing section 520 to perform a variety of processes for the image stabilization, the posture control, the GPS autonomous navigation, and so on.

Further, in the present embodiment, the clock signal generation circuit 150 generates the clock signal using the CR oscillator circuit 170. The CR oscillator circuit 170 is supplied with the power supply voltage having a negative temperature characteristic as explained with reference to FIG. 1, and generates the clock signal due to the CR oscillation. It should be noted that a circuit configuration different from FIG. 1 or the like can also be adopted as the CR oscillator circuit 170. For example, the voltage generation circuit 160 can also generate the power supply voltage having the negative temperature characteristic without using the work function difference between the transistors.

The control section 140 receives the clock signal from the clock signal generation circuit 150 to perform a variety of control processes. For example, the control section 140 controls the drive circuit 30 and the detection circuit 60 based on the clock signal. The clock signal can also be a signal obtained by dividing the frequency of the oscillation signal of the CR oscillator circuit 170.

The clock signal generation circuit 150 is set to the operation enable state by releasing the power-on reset state, and then supplies the control section 140 with the clock signal. Then, the control section 140, which begins the operation in response to the supply with the clock signal, starts up the drive circuit 30 and the detection circuit 60. Then, the control section 140 makes the operation of these circuits be started.

The detection circuit 60 includes an A/D converter circuit 100. The A/D converter circuit 100 performs an A/D conversion based on the clock signal (e.g., the clock signal divided in frequency) from the clock signal generation circuit 150. For example, the A/D converter circuit 100 converts the analog detection signal (the desired signal) into a digital signal (digital data).

Then, a DSP section (a digital signal processing section) 110 provided to the control section 140 receives the digital signal from the A/D converter circuit 100, and then performs digital signal processing on the digital signal. The digital signal processing (DSP) section 110 performs the digital signal processing based on the clock signal from the clock signal generation circuit.

It should be noted that although in FIG. 12, there is shown an example of the case in which the vibrator 10 is a tuning-fork type, the vibrator 10 according to the present embodiment is not limited to such a configuration. For example, the vibrator 10 can also be a T type, a double T type, and so on. Further the piezoelectric material of the vibrator 10 can also be other than the quartz crystal.

5. Detection Device

Figure 13:
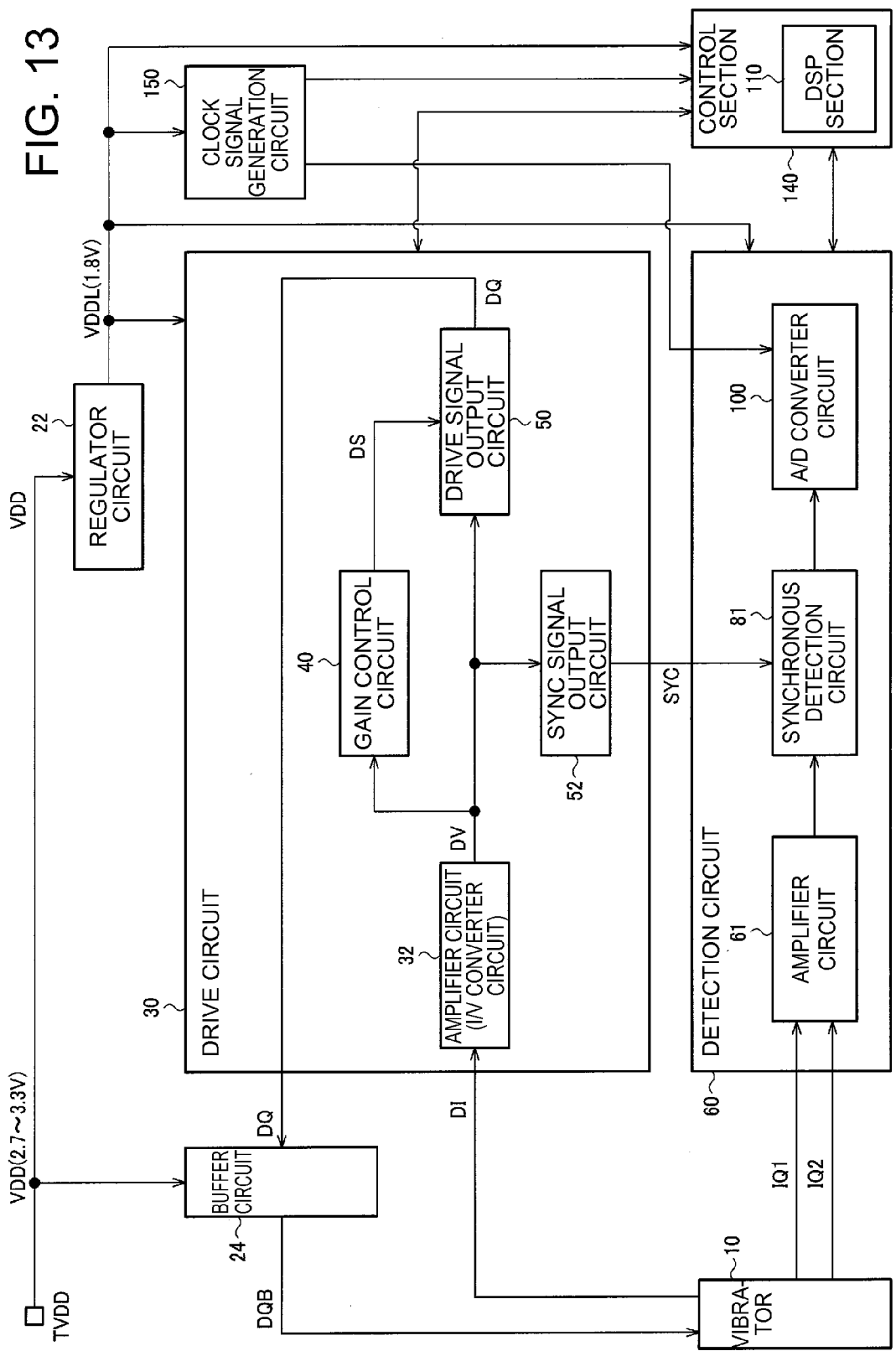
FIG. 13 is a diagram showing a detailed configuration example of the detection device according to the embodiment.

FIG. 13 shows a detailed configuration example of the detection device 20 of the present embodiment. The detection device 20 includes the drive circuit 30 for receiving the feedback signal DI from the vibrator 10 (the physical quantity transducer) to drive the vibrator 10, and the detection circuit 60 for receiving the detection signals IQ1, IQ2 from the vibrator 10 to detect the desired signal. Further, the detection device 20 (an integrated circuit device) includes the control section 140, and the clock signal generation circuit 150. Further, the detection device 20 can also include a power supply terminal TVDD to which the power supply voltage VDD is input, a regulator circuit 22, and a buffer circuit 24.

For example, an external power supply voltage VDD is input to the power supply terminal TVDD. The power supply voltage VDD is supplied to the regulator circuit 22 and the buffer circuit 24. The power supply terminal TVDD is, for example, a pad in the integrated circuit device (an IC chip).

The regulator circuit 22 performs a voltage adjustment for stepping down the power supply voltage VDD supplied from the power supply terminal TVDD. Then, the regulator circuit 22 supplies the drive circuit 30 and the detection circuit 60 with a regulated power supply voltage VDDL obtained by the voltage adjustment as the operating power supply voltage. Further regulator circuit 22 supplies the control section 140 and the clock signal generation circuit 150 with the regulated power supply voltage VDDL. For example, in the case in which the voltage of 2.7 V through 3.3 V is supplied as the external power supply voltage VDD, the regulator circuit 22 performs the voltage adjustment of stepping down the power supply voltage VDD to supply the drive circuit 30, the detection circuit 60, and control section 140, and the clock signal generation circuit 150 with the regulated power supply voltage VDDL at a constant voltage of, for example, 1.8 V.

Further, as shown in FIG. 1, the voltage generation circuit 160 of the clock signal generation circuit 150 generates the power supply voltage VDOS based on the regulated power supply voltage VDDL. For example, the voltage generation circuit 160 generates the power supply voltage VDOS obtained by further stepping down the regulated power supply voltage VDDL.

The buffer circuit 24 is supplied with the power supply voltage VDD. The power supply voltage VDD is used as the high-potential side power supply voltage of the buffer circuit 24. Further, the buffer circuit 24 receives a drive signal DQ from the drive circuit 30, and outputs a drive signal (an amplified drive signal) DQB, which is obtained by increasing the amplitude of the drive signal DQ, and has a high amplitude, to the vibrator 10 (the physical quantity transducer). For example, in the case of assuming the amplitude of the drive signal DQ as a first amplitude, the buffer circuit 24 outputs the drive signal DQB having a second amplitude larger than the first amplitude to the vibrator 10. In this case, the drive signals DQ, DQB can also be rectangular-wave signals, or can also be sinusoidal signals.

The drive circuit 30 includes an amplifier circuit 32 to which the feedback signal DI from the vibrator 10 is input, a gain control circuit 40 for performing automatic gain control, and a drive signal output circuit 50 for outputting the drive signal DQ to the vibrator 10. Further, the drive circuit 30 includes a sync signal output circuit 52 for outputting a sync signal SYC to the detection circuit 60. It should be noted that the configuration of the drive circuit 30 is not limited to FIG. 13, but a variety of practical modifications such as elimination of some of the constituents or addition of other constituents are possible.

The amplifier circuit 32 (an I/V converter circuit) amplifies the feedback signal DI from the vibrator 10. For example, the amplifier circuit 32 converts the current signal DI from the vibrator 10 into a voltage signal DV, and then outputs the voltage signal DV. The amplifier circuit 32 can be realized by a capacitor, a resistor element, an operational amplifier, and so on.

The drive signal output circuit 50 outputs the drive signal DQ based on the signal DV having been amplified by the amplifier circuit 32. For example, in the case in which the drive signal output circuit 50 outputs a rectangular-wave (or sinusoidal) drive signal, the drive signal output circuit 50 can be realized by a comparator or the like.

The gain control circuit 40 (AGC) outputs a control voltage DS to the drive signal output circuit 50 to control the amplitude of the drive signal DQ. Specifically, the gain control circuit 40 monitors the signal DV to control the gain of the oscillation loop. For example, in the drive circuit 30, in order to keep the sensitivity of the gyro sensor constant, it is necessary to keep the amplitude of the drive voltage supplied to the vibrator 10 (the driving vibrator) constant. Therefore, the gain control circuit 40 for automatically controlling the gain is disposed in the oscillation loop of a driving vibration system. The gain control circuit 40 automatically adjusts the gain in a variable manner so that the amplitude (the vibration velocity v of the vibrator) of the feedback signal DI from the vibrator 10 becomes constant.

The sync signal output circuit 52 receives the signal DV having been amplified by the amplifier circuit 32, and then outputs the sync signal SYC (a reference signal) to the detection circuit 60. The sync signal output circuit 52 can be realized by a comparator for performing a binarization process of the sinusoidal (alternating-current) signal DV to generate the rectangular-wave sync signal SYC, a phase adjustment circuit (a phase shifter) for performing a phase adjustment of the sync signal SYC, and so on.

The detection circuit 60 includes an amplifier circuit 61, a synchronous detection circuit 81, and the A/D converter circuit 100. The amplifier circuit 61 receives the first and second detection signal IQ1, IQ2 from the vibrator 10, and then performs signal amplification and charge-voltage conversion. The synchronous detection circuit 81 performs the synchronous detection based on the sync signal SYC from the drive circuit 30. The A/D converter circuit 100 performs the A/D conversion of the signal having synchronously been detected.

The control section 140 performs a control process of the detection device 20. The control section 140 can be realized by a logic circuit (e.g., a gate array), a processor, or the like. The control section 140 performs a variety of switch control, mode setting, and so on in the detection device 20.

6. Operation of Detection Device

Figure 14:
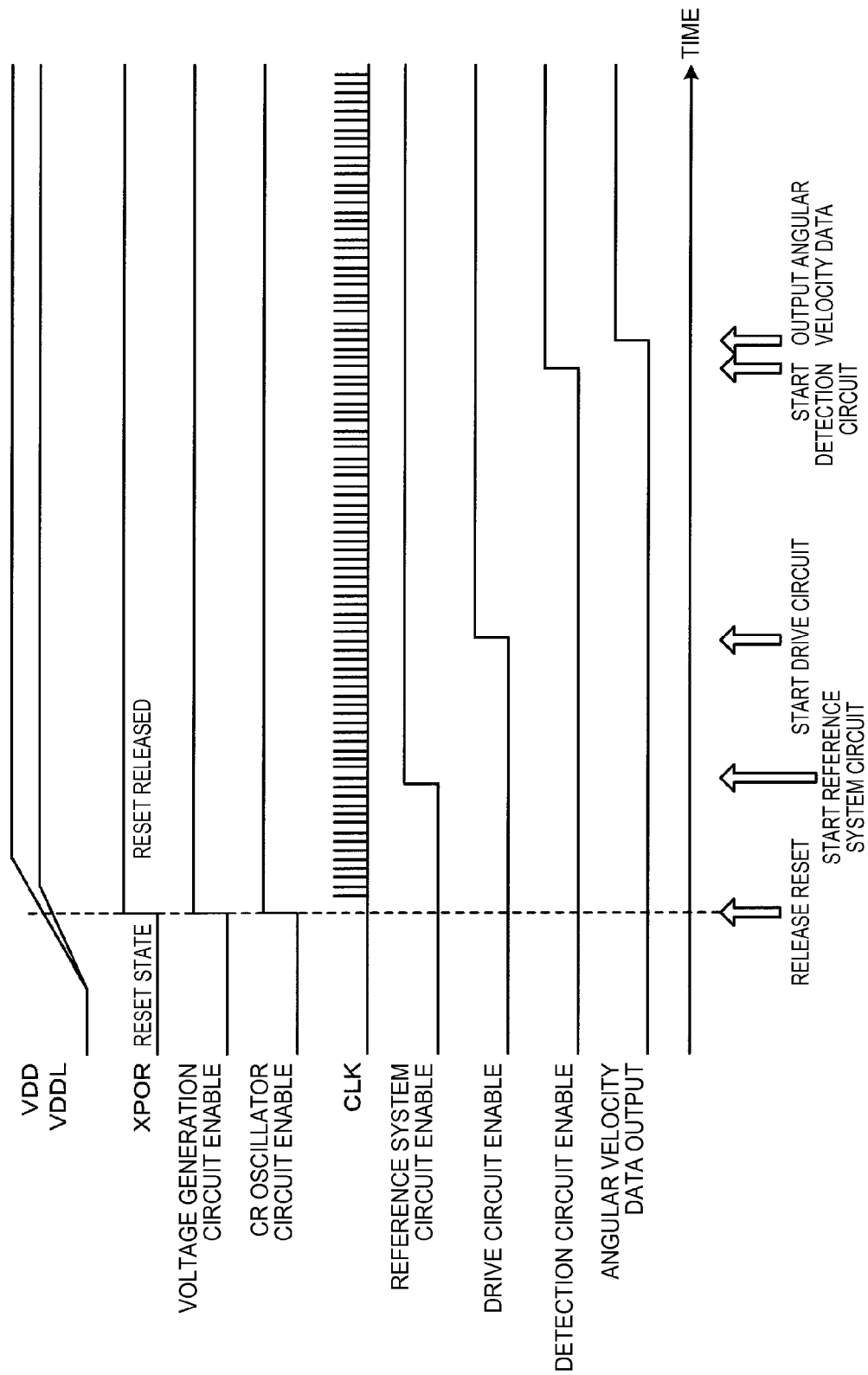
FIG. 14 is an explanatory diagram of a start-up operation of the detection device.

Secondary, an operation of the detection device 20 when starting up will be explained using FIG. 14.

After powered on, when the power supply voltage VDD rises, the power-on reset signal XPOR changes from an L level to an H level, and the voltage generation circuit 160 and the CR oscillator circuit 170 are set to the operation enable state due to release of the power-on reset. For example, the enable signal EN shown in FIG. 1 is set to the H level, and the oscillation operation of the CR oscillator circuit 170 is started up. Then, when the CR oscillation by the CR oscillator circuit 170 becomes in the oscillating state, the clock signal CLK generated by the clock signal generation circuit 150 is supplied to the control section 140, and then the control operation of the control section 140 starts.

Specifically, a reference system circuit is first set to the operation enable state to start up due to the control by the control section 140. The reference system circuit denotes, for example, a generation circuit of a reference current and a reference voltage.

After the start-up of the reference system circuit, the drive circuit 30 is set to the operation enable state to start up due to the control by the control section 140. Then, the vibrator 10 is driven by the drive signal DQ from the drive circuit 30, and the oscillation loop of the vibrator 10 is formed, and the vibrator 10 becomes in the oscillating state.

Subsequently, the detection circuit 60 is set to the operation enable state to start up due to the control by the control section 140. Then, the detection circuit 60 performs the detection process of the desired signal, and it becomes that the angular velocity data is output from the detection device 20.

FIG. 15 is an explanatory diagram of operation modes of the detection device 20 of the present embodiment. As the operation modes of the detection device 20, there exist a normal operation mode, a standby mode, and a sleep mode.

In the normal operation mode, all of the regulator circuit 22, the voltage generation circuit 160, the CR oscillator circuit 170, the drive circuit 30, the detection circuit 60, and the DSP section 110 operate.

In the standby mode, although the regulator circuit 22, the voltage generation circuit 160, the CR oscillator circuit 170, and the drive circuit 30 operate, the detection circuit 60 and the DSP section 110 stop the operations. The standby mode is a mode for keeping the vibrator 10, which is formed of quartz crystal and takes time to start up the oscillation, in the operating state, and by changing the mode from the standby mode back to the normal operation mode, the detection operation of the angular velocity is resumed. Specifically, in the standby mode, although the detection operation of the detection circuit 60 and the signal processing of the DSP section 110 are stopped, the drive of the vibrator 10 by the drive circuit 30 continues. Therefore, although the detection process of the angular velocity is not achievable, the oscillating state of the vibrator 10 due to the drive circuit 30 is maintained. Therefore, in the case of switching from the standby mode to the normal operation mode, there is no need for doing the start-up of the oscillation of the vibrator 10 over again, and the detection process of the angular velocity can promptly be resumed. Further, by stopping the operations of the detection circuit 60 and the DSP section 110 in the standby mode, reduction in power consumption can be achieved.

In the sleep mode, although the regulator circuit 22 operates, the rest of the circuits stop operations. Further, the control section 140 becomes in a standby state for an external command. For example, only the interface section for receiving a command out of the control section 140 continues the operation to thereby create the state in which the external command can be received. In the sleep mode, since the circuits except the regulator circuit 22 stop the operations, the reduction in power consumption can further be achieved than in the standby mode.

For example, in the gyro sensor of the related art, the control section 140 is made to operate using a clock signal having the same frequency as the oscillation frequency (a drive frequency) of the vibrator 10. Specifically, the control section 140 is made to operate using the sync signal SYC for the synchronous detection as the clock signal.

However, the oscillation frequency of the vibrator 10 is, for example, 100 kHz, which is not so high. Therefore, a high-speed operation of the control section 140 is not achievable. Further, since the stable clock signal cannot be obtained until the oscillation of the vibrator 10 is stabilized, the start-up time until the beginning of detection of a desired signal is delayed, and there is a problem that it takes long time before appropriate angular velocity data is output.

In this regard, in the present embodiment, the clock signal of the control section 140 is generated using the CR oscillation by the CR oscillator circuit 170. Specifically, the CR oscillator circuit 170 operates while being supplied with the power supply voltage having the negative temperature characteristic, and the clock signal obtained by the CR oscillation is supplied to the control circuit 140. Further, in the CR oscillation, the time until the oscillation becomes in the steady state is short compared to the oscillation of the vibrator 10. Therefore, as shown in FIG. 14, it is possible to speed up the start-up of the circuits such as the drive circuit 30 or the detection circuit 60 by the control section 140. Further, according to the CR oscillation, a high-frequency clock signal of, for example, 4 MHz can easily be generated. Therefore, speeding-up of the processes of the control section 140, the DSP section 110, the A/D converter circuit 100, and so on can also be achieved.

In particular, in the digital gyroscope having the A/D converter circuit 100 and the DSP section 110 incorporated in the detection device 20, it is necessary to perform a heavy load process such as a digital filter process. In this regard, according to the present embodiment, since the high-rate clock signal can be generated by the CR oscillation circuit 170 capable to raising the oscillation frequency compared to the vibrator 10, there is an advantage that the heavy load process such as the digital signal processing can also be performed at high speed.

On the other hand, if the frequency variation of the clock signal due to the temperature variation is large, there is a possibility that the detection performance and so on of the detection device 20 degrade. For example, if the sampling frequency of the A/D converter circuit 100, the clock frequency of the digital signal processing, and so on vary with the temperature variation, there is a possibility that the performance of the gyro sensor degrades. According to the method of the related art, in which the clock signal is generated using the oscillation of the vibrator 10 made of quartz crystal, the frequency variation of the clock signal due to the temperature variation can be suppressed to a low level. However, in the case of the CR oscillation, there is a problem that the frequency variation becomes large.

In this regard, in the present embodiment, the clock signal is generated by supplying the CR oscillator circuit 170, the oscillation frequency of which has a positive temperature characteristic in the case in which the power supply voltage is fixed, with the power supply voltage having a negative temperature characteristic. According to this configuration, since the positive temperature characteristic of the oscillation frequency of the CR oscillator circuit 170 is canceled out with the negative temperature characteristic of the power supply voltage, the frequency variation in the clock signal due to the temperature variation can be kept to the minimum. Therefore, it becomes possible to keep the degradation of the detection performance of the detection device 20 and so on to the minimum while achieving speeding-up of the process and the start-up of each of the circuits using the CR oscillation.

7. Details of Drive Circuit

Figure 16:
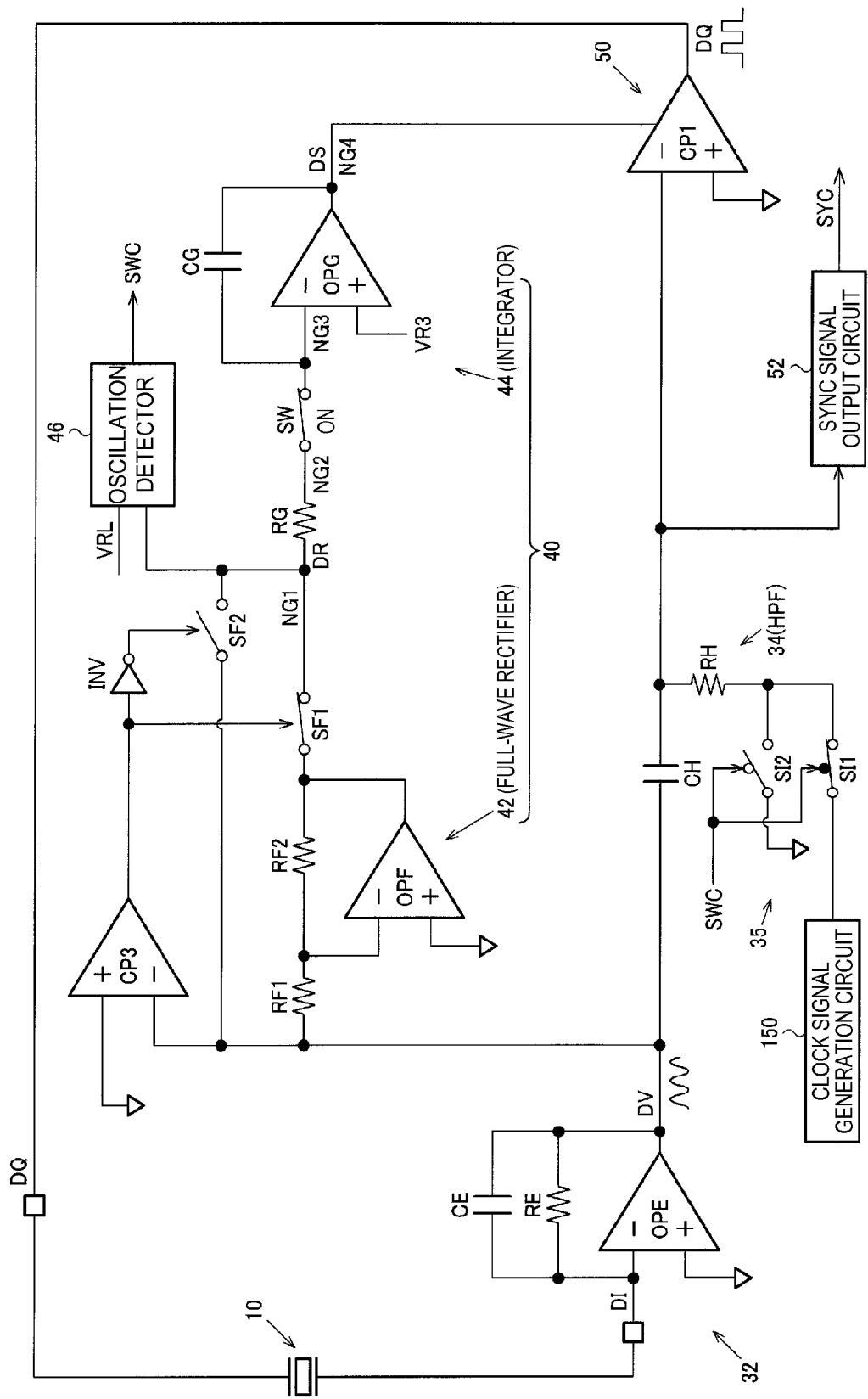
FIG. 16 is a diagram showing a detailed configuration example of a drive circuit.

FIG. 16 shows a detailed configuration example of the drive circuit 30. In FIG. 16, the amplifier circuit 32 is an integration-type current-voltage converter circuit (I/V converter circuit) having a low-pass filter characteristic, and includes an operational amplifier OPE, a capacitor CE, and a resistor element RE. A non-inverting input terminal (a first input terminal) of the operational amplifier OPE is set to a predetermined potential (e.g., AGND), and the signal DI from the vibrator 10 is input to an inverting input terminal (a second input terminal).

A high-pass filter (HPF) 34 is disposed between the amplifier circuit 32 and the drive signal output circuit 50, and outputs the signal DV obtained by the high-pass filter process to the drive signal output circuit 50. The high-pass filter 34 includes a capacitor CH and a resistor element RH.

The gain control circuit 40 (AGC) is a circuit for automatically adjusting the gain so that the loop gain becomes 1 in the steady state of the oscillation, and includes a full-wave rectifier 42 and an integrator 44.

The full-wave rectifier 42 performs full-wave rectification on the output signal DV of the amplifier circuit 32, and outputs a signal DR after the full-wave rectification to the integrator 44. The full-wave rectifier 42 includes an operational amplifier OPF, resistor elements RF1, RF2, a comparator CP3, switch elements SF1, SF2, and an inverter circuit INV.

The switch element SF1 is disposed between an output node of the operational amplifier OPF and an input node NG1 of the integrator 44, and the switch element SF2 is disposed between a node of the signal DV and the input node NG1 of the integrator 44. Further, the switch elements SF1, SF2 are controlled exclusively to be an ON/OFF state based on an output signal of the comparator CP3 for comparing the voltage of the signal DV and the voltage of a predetermined potential. Thus, the signal DR becomes a signal obtained by performing the full-wave rectification on the signal DV.

The integrator 44 outputs a control voltage DS of the amplitude of the drive signal DQ to the drive signal output circuit 50. Specifically, the integrator 44 performs an integration process of the signal DR obtained by the full-wave rectifier 42 performing the full-wave rectification, and then outputs the control voltage DS obtained by the integration process to the drive signal output circuit 50.

The integrator 44 includes an operational amplifier OPG, a resistor element RG, and a capacitor CG. A non-inverting input terminal of the operational amplifier OPG is set to a predetermined voltage VR3.

A comparator CP1 constituting the drive signal output circuit 50 has a non-inverting input terminal set to a predetermined potential (e.g., AGND), and the signal DV (the signal obtained by the filter process) obtained by the amplification in the amplifier circuit 32 is input to an inverting input terminal. Then, the comparator CP1 outputs the drive signal DQ of a rectangular wave obtained by binarizing the signal DV. The comparator CP1 includes a differential section and an output section connected to the differential section. Further, the control voltage DS from the gain control circuit 40 (an integrator) is supplied as the power supply voltage (the high-potential side power supply voltage) of the output section of the comparator CP1. Thus, it becomes that the amplitude of the drive signal DQ output by the comparator CP1 varies in accordance with the control voltage DS of the gain control circuit 40, and thus the gain control for setting the loop gain to 1 in the steady state of the oscillation is realized.

It should be noted that the configuration of the drive circuit 30 is not limited to the configuration shown in FIG. 16, but a variety of practical modifications can be adopted. For example, although in FIG. 16, the drive signal output circuit 50 is formed of the comparator CP1 for outputting the drive signal DQ of the rectangular wave, the drive signal output circuit 50 can also be formed of a gain amplifier or the like for outputting the drive signal DQ of a sinusoidal wave. In this case, it is sufficient to control the amplitude of the drive signal DQ by controlling the gain of the gain amplifier based on the control voltage DS from the gain control circuit 40.

As shown in FIG. 16, in the present embodiment, the high-pass filter 34 is disposed between the amplifier 32 and the drive signal output circuit 50. Further, in the start-up period of the oscillation of the vibrator 10, the clock signal (the clock signal itself or a clock signal obtained by dividing the frequency of the clock signal) from the clock signal generation circuit 150 is input to the drive signal output circuit 50 via the resistor element RH constituting the high-pass filter 34.

Specifically, in FIG. 16, there is disposed a seed circuit 35. The seed circuit 35 includes switch elements SI1, SI2. The switch elements SI1, SI2 are controlled by a detection signal SWC to be the ON/OFF state. The detection signal SWC is generated by an oscillation detector 46 for detecting the oscillated state. The oscillation detector 46 detects the oscillated state by monitoring an oscillation detecting voltage as a voltage obtained by smoothing the signal DR, which has been obtained by the full-wave rectification, with a low-pass filter, and then outputs the detection signal SWC.

For example, the high-pass filter 34 is provided for suppressing a harmful influence of an DC offset voltage and so on of the amplifier circuit 32, and in the case of providing the high-pass filter 34, the seed circuit 35 for generating a seed of the oscillation is needed.

Further, since in the initial state after powered on, the detection signal SWC from the oscillation detector 46 is set to the H level, the switch element SI1 of the seed circuit 35 is set to the ON state, and the switch element SI2 is set to the OFF state. Therefore, the clock signal from the clock signal generation circuit 150 is input to the non-inverting input terminal of the comparator CP1 via the switch element SI1 and the resistor element RH. Thus, it becomes possible to form a seed of the oscillation, and grow the oscillation.

Meanwhile, when the oscillation of the vibrator 10 grows in the oscillation start-up process, the oscillation detecting voltage described above, which is the voltage obtained by smoothing the signal DR obtained by the full-wave rectification, rises. Further, in the case in which the oscillation detecting voltage exceeds a reference voltage VRL, the oscillation detector 46 determines that the oscillation start-up period has been completed, and then changes the detection signal SWC from the H level to the L level. When the detection signal SWC becomes in the L level, the switch element SI1 of the seed circuit 34 is set to the OFF state, and the switch element SI2 is set to the ON state. Thus, it becomes that the clock signal from the clock signal generation circuit 150 is not input to the non-inverting input terminal of the comparator 50.

Specifically, in FIG. 16, the high-pass filter 34 is provided in order to inhibit the DC offset voltage of the amplifier circuit 32 from being transferred to the drive signal output circuit 50 to exert a harmful influence on the generation of the drive signal DQ. By providing the high-pass filter 34, the DC component of the signal DV from the amplifier circuit 32 can be cut.

However, if such a high-pass filter 34 is provided, the filter action of the high-pass filter 34 becomes a factor for hindering the generation and the growth of the seed of the oscillation in the oscillation start-up process, and there is a possibility of causing a problem that the oscillation of the vibrator 10 fails to be started up, or the start-up of the oscillation is delayed.

Therefore, in FIG. 16, the seed circuit 35 is disposed. Further, in the start-up period of the oscillation of the vibrator 10 in which the switch element SI1 is set to the ON state, the clock signal from the clock signal generation circuit 150 is input to the drive signal output circuit 50 via the resistor element RH of the high-pass filter 34.

According to this configuration, it becomes that the clock signal from the clock signal generation circuit 150 acts as the seed of the oscillation to grow the oscillation, and thus, an appropriate oscillation start-up and shortening of the oscillation start-up period and so on of the vibrator 10 can be realized.

In particular, the clock signal generation circuit 150 generates the clock signal using the CR oscillator circuit 170, and can therefore output the clock signal in a short period of time after powered on. Therefore, it results that the generation and growth of the seed are also performed promptly, it becomes possible to further shorten the oscillation start-up period.

8. High-Amplitude Drive Using Buffer Circuit

In the present embodiment, as shown in FIG. 13, the voltage adjustment of stepping down the external power supply voltage VDD is performed using the regulator circuit 22, and the regulated power supply voltage VDDL on which the voltage adjustment has been performed is supplied to the drive circuit 30, the detection circuit 60, and the clock signal generation circuit 150. Further, the drive circuit 30 and the detection circuit 60 operate using the regulated power supply voltage VDDL as the operating power supply voltage. Further, the voltage generation circuit 160 of the clock signal generation circuit 150 generates the power supply voltage VDOS of the CR oscillator circuit 170 based on the regulated power supply voltage VDDL.

As described above, by generating the regulated power supply voltage VDDL having been adjusted so as to be a constant voltage, and then making the drive circuit 30, the detection circuit 60, and so on operate using the regulated power supply voltage VDDL, an improvement of the detection performance and so on can be realized.

Further, if the voltage generation circuit 160 generates the power supply voltage VDOS based on the regulated power supply voltage VDDL, the frequency variation of the clock signal due to the power supply voltage variation can be suppressed. In other words, it becomes possible to suppress the frequency variation of the clock signal due to not only the temperature variation but also the power supply voltage variation.

For example, in the configuration of making the drive circuit 30, the detection circuit 60, and so on operate using the external power supply voltage VDD as in the related art, in the case in which the voltage variation occurs in the power supply voltage VDD, there is a possibility that, for example, the 0-point variation or the like occurs due to the voltage variation.

In this regard, in the present embodiment, instead of making the drive circuit 30, the detection circuit 60, and so on operate using the power supply voltage VDD as the operating power supply voltage, the drive circuit 30, the detection circuit 60, and so on are made to operate using the regulated power supply voltage VDDL generated by the regulator circuit 22 as the operating power supply voltage. According to this configuration, even in the case in which the voltage variation occurs in the power supply voltage VDD, since the voltage variation is absorbed by the regulator circuit 22, it is possible to inhibit the voltage variation of the power supply voltage VDD from being transferred to the drive circuit 30, the detection circuit 60, and the clock signal generation circuit 150.

In other words, by using the regulator circuit 22 according to the present embodiment, even in the case in which, for example, the power supply voltage VDD varies in a range of 2.7 V through 3.3 V, it is possible to suppress the voltage variation of the regulated power supply voltage VDDL to, for example, a level equal to or lower than 1 mV (e.g., equal to or lower than 0.3 mV). Further, also in the case in which the temperature variation occurs, it is possible to suppress the variation of the regulated power supply voltage VDDL to, for example, a value equal to or smaller than ±several tens of millivolts (e.g., equal to or smaller than ±30 mV). Therefore, even in the case in which there exists a variation in the power supply voltage VDD, the variation in the regulated power supply voltage VDDL can be kept to the minimum, and therefore, it is possible to inhibit the situation in which the 0-point (an output in the rest state of the gyroscope) varies due to the variation in the power supply voltage VDD to degrade the detection performance.

Figure 17A:
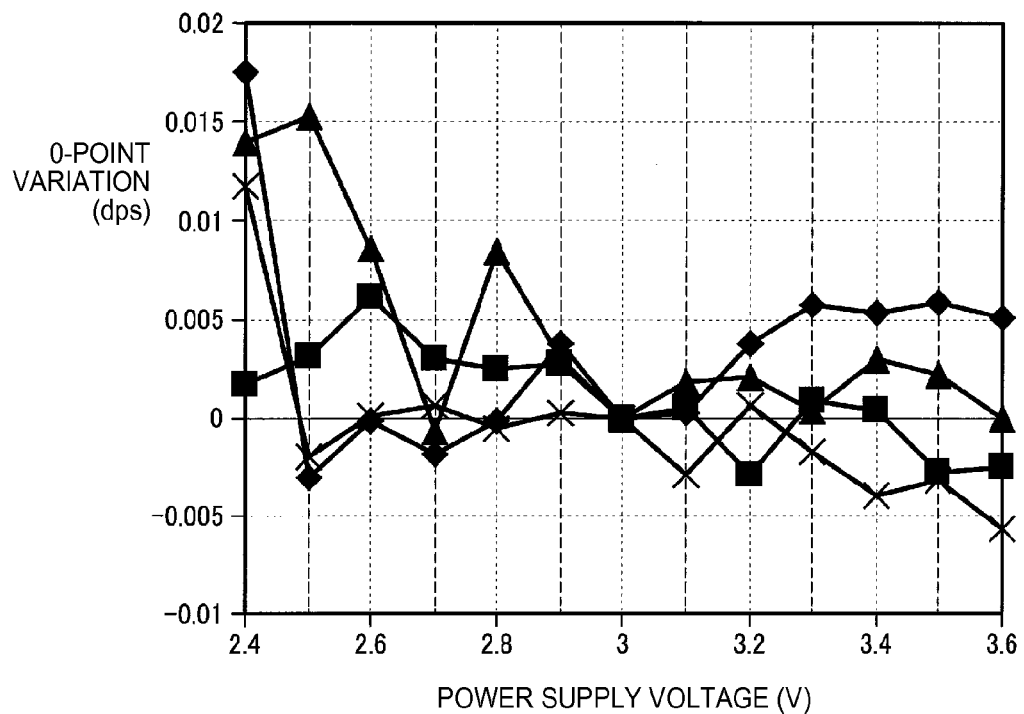
FIG. 17A is a diagram showing a relationship between a power supply voltage VDD and a 0-point variation.

For example, FIG. 17A is a diagram showing a relationship (the number of samples is four) between the power supply voltage VDD and the 0-point variation in the case of using the regulator circuit 22 as in the present embodiment. As shown in FIG. 17A, in the present embodiment, even in the case in which, for example, the power supply voltage VDD varies within the range of 2.7 V through 3.3 V, it becomes possible to keep the 0-point variation (dps: degree per second) to the minimum (e.g., equal to or smaller than 0.01 dps).

Further, according to the present embodiment, it is possible to make the drive circuit 30, the detection circuit 60, and so on constituting a large portion of the circuits of the detection device operate with the low regulated power supply voltage VDDL. Therefore, since it results that the large portion of the circuits operates with the low power supply voltage, there is an advantage that the power consumption can effectively be reduced.

Figure 17B:
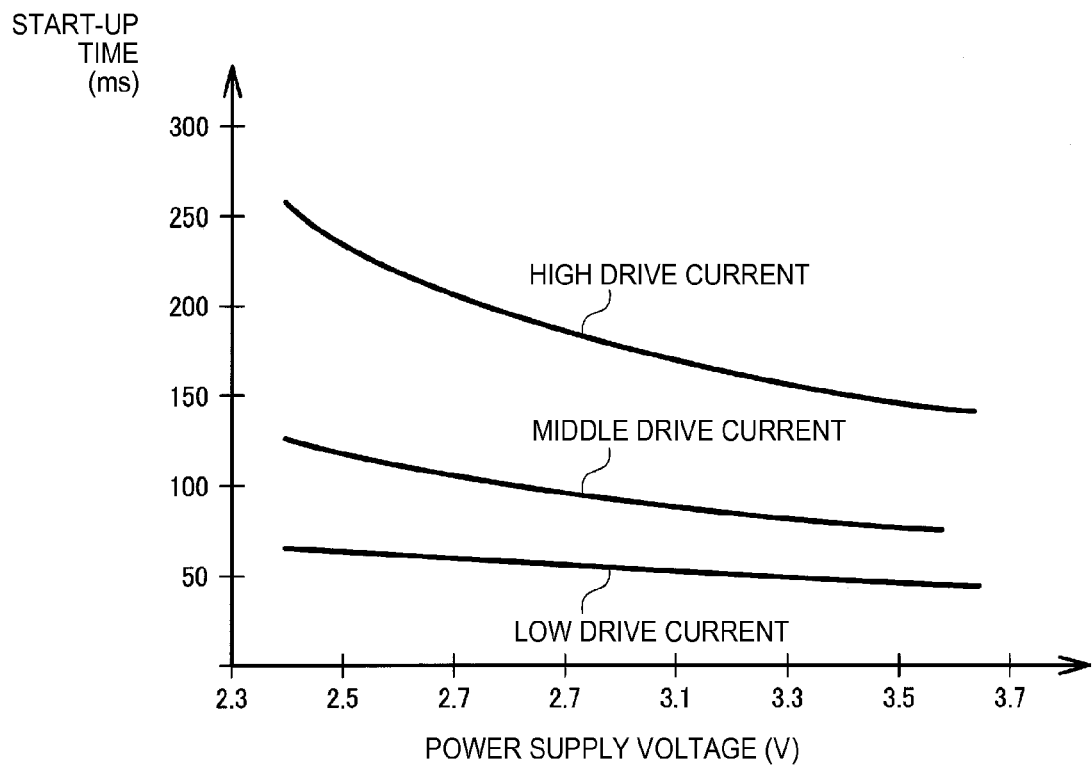
FIG. 17B is a diagram showing a relationship between the power supply voltage and the start-up time.

However, if the drive circuit 30 and so on are made to operate with the regulated power supply voltage VDDL as the low voltage in such a manner as described above, there arises, in turn, a problem that the start-up time of the oscillation is elongated. For example, FIG. 17B is a diagram showing a relationship between the power supply voltage and the start-up time. As shown in FIG. 17B, the lower the power supply voltage becomes, the longer the start-up time becomes. For example, as shown in FIG. 17B, the higher the drive current of the vibrator 10 is, the longer the start-up time becomes. Further, in the case in which the drive current is high, the start-up time is elongated in an exponential manner, and might exceed an allowable range if the power supply voltage is equal to or lower than, for example, about 2.7 V. In other words, if the regulated power supply voltage VDDL (e.g., 1.8 V) is used as the power supply voltage of the drive circuit 30 and so on, the start-up time becomes extremely long, and might become a level inappropriate for a practical use.

Therefore, in the present embodiment, as shown in FIG. 13, the regulated power supply voltage VDDL generated by the regulator circuit 22 is supplied to the drive circuit 30, the detection circuit 60, and so on to thereby achieve an improvement in detection performance and reduction in power consumption on the one hand, and the power supply voltage VDD is supplied to the buffer circuit 24 for buffering the drive signal DQ instead of the regulated power supply voltage VDDL on the other hand. In other words, while in the related art, the power supply voltage VDD is supplied to all of the circuits of the detection device, in the present embodiment, the circuits (the integrated circuit devices) of the detection device are separated into a first circuit portion supplied with the regulated power supply voltage VDDL and a second circuit portion supplied with the power supply voltage VDD. Further, the drive circuit 30, the detection circuit 60, the control section 140, and the clock signal generation circuit 160 for which an improvement in detection performance or reduction in power consumption is required are included in the first circuit portion to be supplied with the regulated power supply voltage VDDL on the one hand, while the buffer circuit 24 is included in the second circuit portion to be directly supplied with the power supply voltage VDD on the other hand.

Further, the buffer circuit 24 performs a conversion for increasing the amplitude of the drive signal DQ from the drive circuit 30 using the power supply voltage VDD supplied, and then outputs a high-amplitude drive signal (an amplified drive signal) DQB to the vibrator 10. Specifically, the buffer circuit 24 generates the drive signal DQB having a peak-to-peak voltage higher than the peak-to-peak voltage of the drive signal DQ, and then drives the vibrator 10 with the drive signal DQB.

According to this configuration, as is obvious from FIG. 17B, the start-up time can be reduced compared to the case of driving the vibrator 10 with the drive signal DQ using the regulated power supply voltage VDDL. Therefore, the present embodiment is successful in realizing both of the improvement in detection performance and reduction in power consumption, and shortening of the start-up time.

Figure 18:
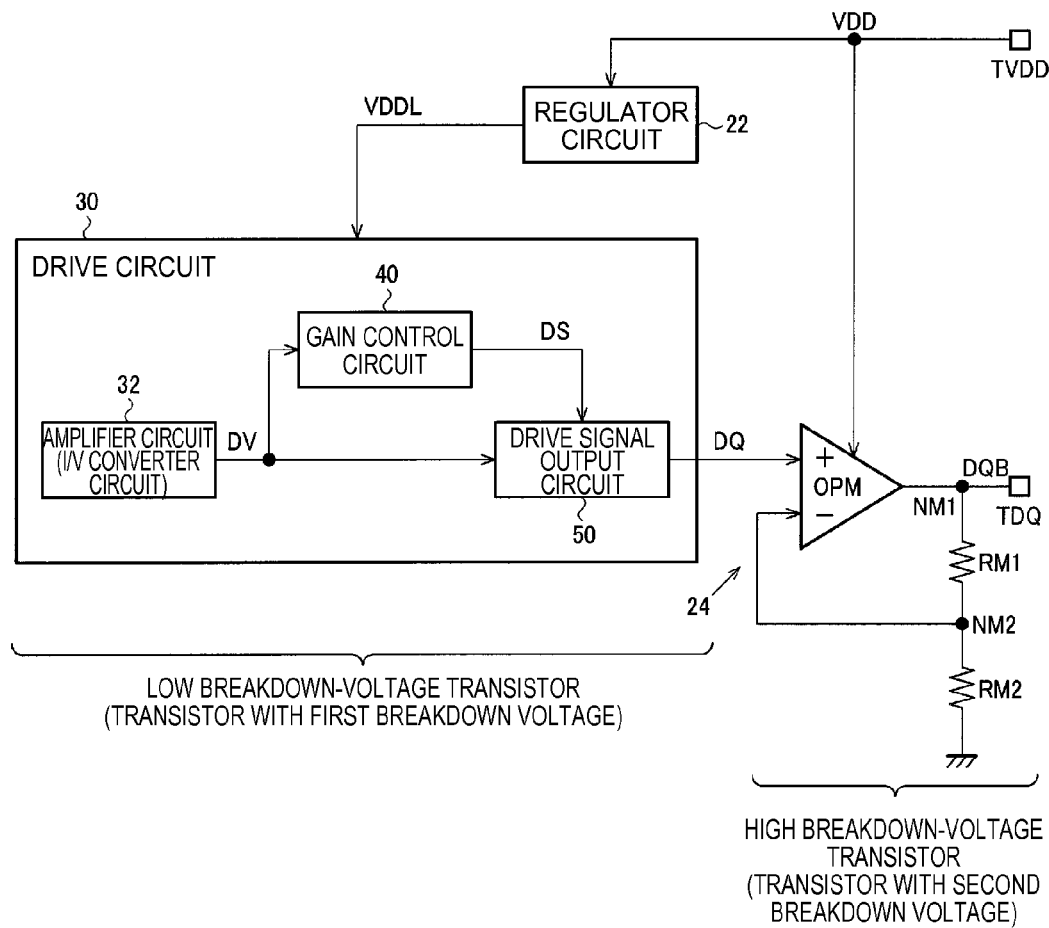
FIG. 18 is a diagram showing a configuration example of a buffer circuit.

Then, a specific configuration example of the buffer circuit 24 will be explained. FIG. 18 shows a first configuration example of the buffer circuit 24.

In FIG. 18, the buffer circuit 24 includes an operational amplifier OPM, and first and second resistor elements RM1, RM2. The drive signal DQ from the drive circuit is input to the non-inverting input terminal of the operational amplifier OPM. The operational amplifier OPM operates using the power supply voltage VDD from the power supply terminal TVDD as the operating power supply voltage. The first and second resistor elements RM1, RM2 are disposed in series between an output node NM1 of the high-amplitude drive signal DQB and a node of the low-potential side power supply (GND). Further, a connection node NM2 between the first and second resistor elements RM1, RM2 is connected to the inverting input terminal of the operational amplifier OPM. It should be noted that the regulator circuit 22 can also be realized with substantially the same configuration as that of the buffer circuit 24 shown in FIG. 18.

In FIG. 18, it is assumed that the resistances of the resistor elements RM1, RM2 are R1, R2, respectively, and the amplitudes of the drive signals DQ, DQB are AP, APB, respectively. Then, the following relational expression becomes true.

$$APB=\{(R1+R2)/R2\} \times AP$$

For example, in the case of R1=200 kΩ and R2=400 kΩ, the following is obtained, and the drive signal DQB becomes a signal obtained by multiplying the amplitude (the peak-to-peak voltage) of the drive signal DQ by 1.5.

$$APB=\{(200 \text{ k}\Omega+400 \text{ k}\Omega)/400 \text{ k}\Omega\} \times AP=1.5 \times AP$$

Therefore, the high-amplitude drive of the vibrator 10 becomes possible, and the shortening of the start-up time of the oscillation can be realized.

Further, in the present embodiment, the drive circuit 30, the detection circuit 60, and so on are constituted by low breakdown-voltage transistors (transistors with a first breakdown voltage), while the buffer circuit 24 is constituted by high breakdown-voltage transistors (transistors with a second breakdown voltage higher than the first breakdown voltage). For example, the low breakdown-voltage transistor is a transistor having a breakdown voltage higher than 1.8 V and lower than the breakdown voltage of the high breakdown-voltage transistor, and the high breakdown-voltage transistor is a transistor having a breakdown voltage higher then 3.3 V. The high breakdown-voltage transistor can be realized by, for example, making the film thickness of a gate oxide film thicker or making the gate length longer than those of the low breakdown-voltage transistor. By constituting the drive circuit 30, the detection circuit 60, and the control section 140 constituting a large portion of the detection device by the low breakdown-voltage transistors, it becomes possible to achieve reduction in power consumption of the detection device and reduction in the area of the circuit layout. By constituting the buffer circuit 24 by the high breakdown-voltage transistors, it is possible to effectively prevent the problem of a trouble, breakage, and so on of the transistors from arising due to the high-amplitude drive.

Figure 19A:
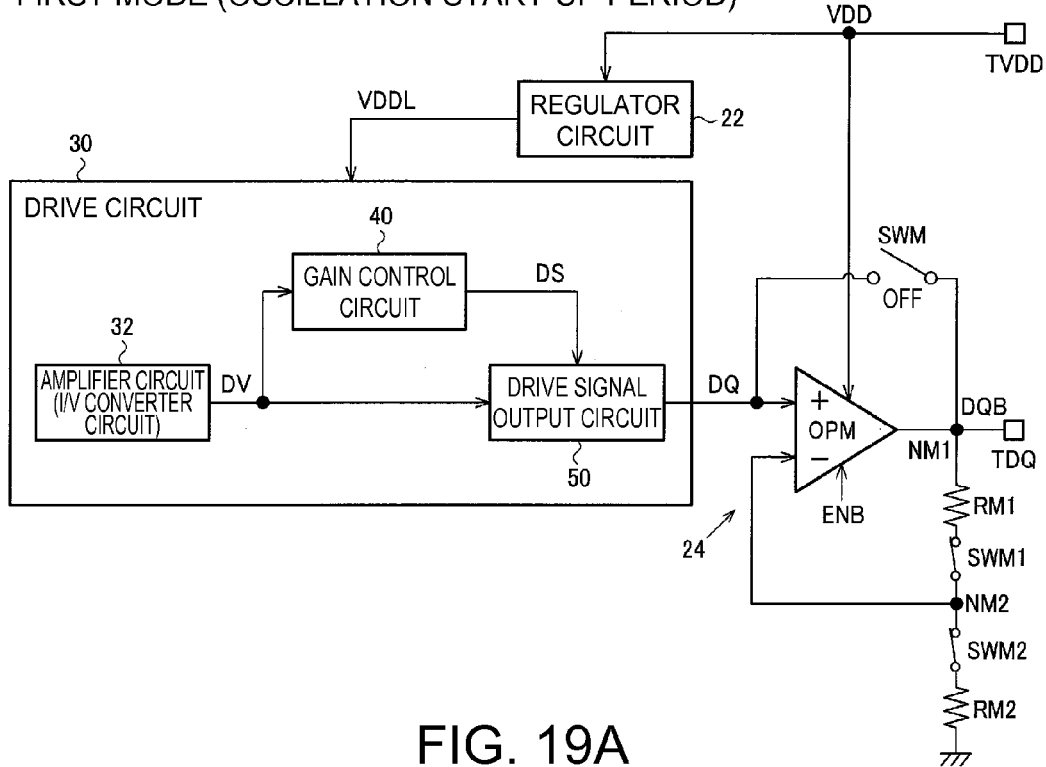
FIGS. 19A and 19B are explanatory diagrams with respect to a first mode and a second mode, respectively.
Figure 19B:
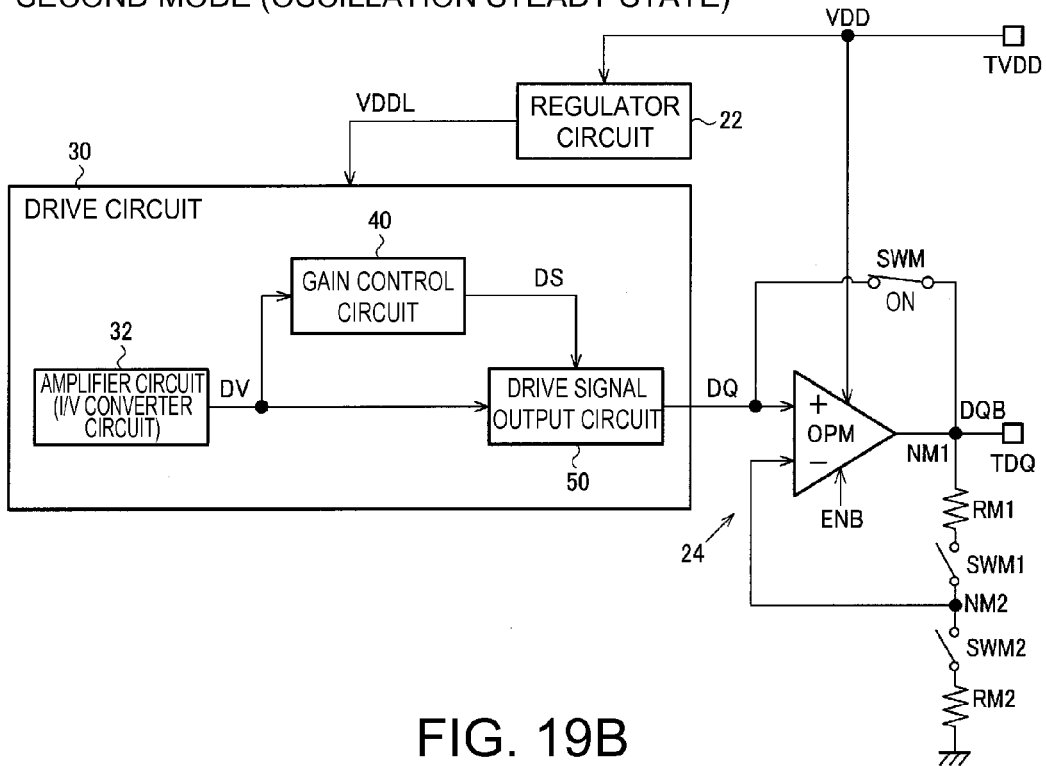

FIGS. 19A and 19B show a second configuration example of the buffer circuit 24. The detection device having the buffer circuit 24 according to the second configuration example outputs the high-amplitude drive signal DQB from the buffer circuit 24 to the vibrator 10 (the physical quantity transducer) in a first mode shown in FIG. 19A. In contrast, in a second mode shown in FIG. 19B, the drive signal DQ from the drive circuit 30 is output to the vibrator 10.

Specifically, in the second configuration example, a switch element SWM is disposed between the output node NM1 and an input node of the buffer circuit 24. Further, as shown in FIG. 19A, the switch element SWM is set to the OFF state in the first mode. Thus, it becomes that the high-amplitude drive signal DQB from the buffer circuit 24 is output to the vibrator 10. It should be noted that on this occasion, the operational amplifier OPM is set to the operation enable state by, for example, an enable signal ENB.

In contrast, in the second mode, the switch element SWM is set to the ON state. Thus, it becomes that the low-amplitude drive signal DQ from the drive circuit 30 is output to the vibrator 10 via the switch element SWM. It should be noted that on this occasion, the operational amplifier OPM is set to the operation disable state by, for example, the enable signal ENB. For example, the output of the operational amplifier OPM is set to a high-impedance state.

Further, in the second configuration example, switch elements SWM1, SWM2 are disposed corresponding to the resistor elements RM1, RM2. Further, in the first mode shown in FIG. 19A, the switch elements SWM1, SWM2 are set to the ON state on the one hand, and the switch elements SWM1, SWM2 are set to the OFF state in the second mode shown in FIG. 19B on the other hand. Thus, in the second mode, it is possible to prevent an unwanted current from flowing from the output node NM1 of the buffer circuit 24 to VSS (GND), or an unwanted voltage from being applied to the inverting input terminal of the operational amplifier OPM.

For example, as shown in FIG. 19A, in the start-up period of the oscillation of the vibrator 10, the detection device is set to the first mode. Thus, the high-amplitude drive signal DQB from the buffer circuit 24 is output to the vibrator 10. In contrast, as shown in FIG. 19B, after completion of the start-up period, the detection device is set to the second mode. For example, in the oscillation steady state, the detection device is set to the second mode. Thus, the low-amplitude drive signal DQ from the drive circuit 30 is output to the vibrator 10.

For example, in the start-up period, it is desirable to perform the high-amplitude drive in order to shorten the start-up time of the oscillation of the vibrator 10. Therefore, in the start-up period, as shown in FIG. 19A, the switch element SWM is set to the OFF state to drive the vibrator 10 using the high-amplitude drive signal DQB from the buffer circuit 24 to thereby achieve shortening of the start-up time.

In contrast, in the case in which the start-up period is complete, and the vibrator 10 becomes in the steady oscillation state, the demand of shortening the start-up time no more exists, and therefore, the switch element SWM is set to the ON state (the switch elements SWM1, SWM2 are set to the OFF state) as shown in FIG. 19B to drive the vibrator 10 using the low-amplitude drive signal DQ from the drive circuit 30. By driving the vibrator 10 with the low-amplitude drive signal DQ in such a manner, it becomes possible to expect reduction in power consumption, noise reduction, and so on. It should be noted that depending on the applications, there are some cases in which the drive by the drive signal DQB using the power supply voltage VDD in a range of, for example, 2.7 V through 3.3 V is desirable even after the start-up period is complete and the vibrator 10 becomes in the steady oscillation state. Therefore, in such cases, the detection device is set to the first mode even after the start-up period is complete.

It should be noted that the setting of the first and second mode can be realized by, for example, a control process of the control section 140. Such setting can be realized by, for example, the control section 140 controlling the ON/OFF states of the switch elements SWM, SWM1, and SWM2. Further, it is possible to set the first and second modes shown in FIGS. 19A and 19B using a register configuration of a register section provided to the detection device. For example, it is possible to arrange that the register section is accessed vie an external interface to perform setting of the first and second mode.

9. Multiaxial Gyro Sensor

Figure 20:
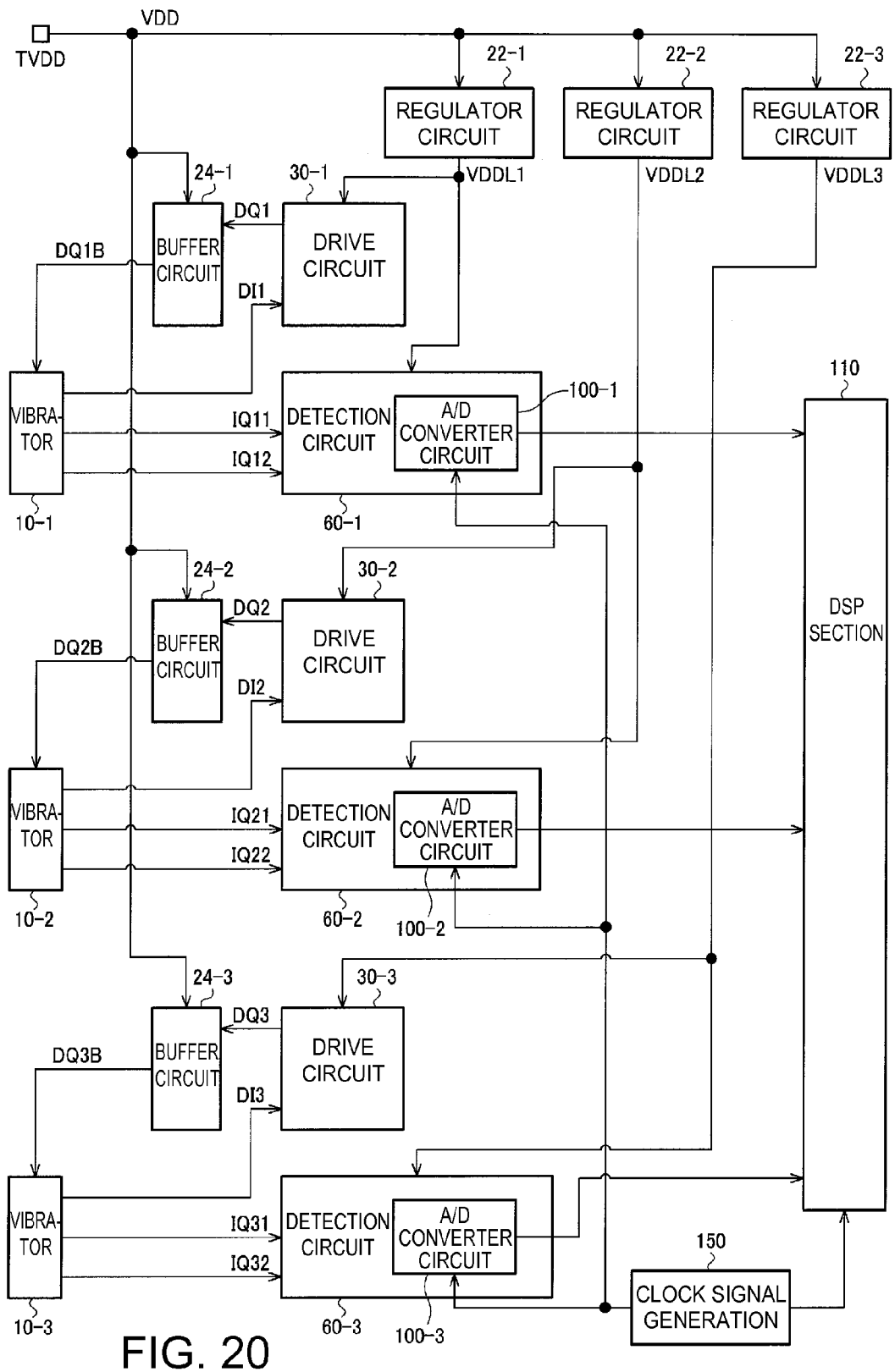
FIG. 20 is a diagram showing another configuration example of the detection device.

FIG. 20 shows a modified example of the present embodiment. FIG. 20 shows a configuration example of the detection device of a multiaxial gyro sensor for performing detection of rotational angular velocities around a plurality of axes. The detection device of the present configuration example performs drive and detection of a plurality of vibrators 10-1, 10-2, and 10-3. Here, for example, the vibrator 10-1 is a vibrator for detecting a rotational angular velocity around a first axis (e.g., an X axis), and the vibrator 10-2 is a vibrator for detecting a rotational angular velocity around a second axis (e.g., a Y axis). Further, the vibrator 10-3 is a vibrator for detecting a rotational angular velocity around a third axis (e.g., a Z axis).

In the multiaxial gyro sensor, a so-called inter-axis interference presents a problem. For example, as a method of a comparative example of the present embodiment, there can be cited a method of making all of the circuits of the detection device operate using the power supply voltage VDD as the operating power supply voltage. However, according to the method of this comparative example, there occurs an inter-axis interference in which a minute variation in the power supply voltage VDD caused by the operation of the drive circuit and the detection circuit for, for example, the first axis exerts a harmful influence on the drive circuit and the detection circuit for each of the second axis and the third axis, and there is a possibility of incurring a problem of degradation in detection performance and so on. For example, as described later, in the present embodiment, the drive frequencies of the vibrators 10-1, 10-2, and 10-3 are made different from each other in order to reduce the influence of the inter-axis interference. If the drive frequencies are different from each other as described above, the harmful influence, which is exerted on the drive circuit and the detection circuit for each of the second axis and the third axis by the variation in the power supply voltage VDD caused by the operation of the drive circuit and the detection circuit for, for example, the first axis, increases. In order to solve such a problem, in the present embodiment, there is adopted a configuration shown in FIG. 20.

Specifically, in FIG. 20, there are disposed a regulator circuit 22-1, a buffer circuit 24-1, a drive circuit 30-1, and a detection circuit 60-1 for the vibrator 10-1, and a regulator circuit 22-2, a buffer circuit 24-2, a drive circuit 30-2, and a detection circuit 60-2 for the vibrator 10-2. Further, there are disposed a regulator circuit 22-3, a buffer circuit 24-3, a drive circuit 30-3, and a detection circuit 60-3 for the vibrator 10-3. It should be noted that although FIG. 20 shows an example of the case of three vibrators, in the case of two vibrators, the constituents of the regulator circuit 22-3, the buffer circuit 24-3, the drive circuit 30-3, and the detection circuit 60-3 for the vibrator 10-3 become unnecessary.

Since the configurations and the operations of the regulator circuit 22-1, the buffer circuit 24-1, the drive circuit 30-1, and the detection circuit 60-1 for the vibrator 10-1 are the same as those of the regulator circuit 22, the buffer circuit 24, the drive circuit 30, and the detection circuit 60 shown in FIG. 13, the detailed explanation thereof will be omitted.

The drive circuit 30-2 (a second drive circuit) for the vibrator 10-2 receives a feedback signal DI2 (a second feedback signal) from the vibrator 10-2 (a second physical quantity transducer), and drives the vibrator 10-2. The detection circuit 60-2 (a second detection circuit) receives detection signals IQ21, IQ22 from the vibrator 10-2 to detect a desired signal.

The regulator circuit 22-2 (a second regulator circuit) performs a voltage adjustment for stepping down the power supply voltage VDD from the power supply terminal TVDD, and outputs the regulated power supply voltage VDDL2 (a second regulated power supply voltage) obtained by the voltage adjustment to the drive circuit 30-2 and the detection circuit 60-2.

Further, the buffer circuit 24-2 (a second buffer circuit) is supplied with the power supply voltage VDD, receives a drive signal DQ2 (a second drive signal) from the drive circuit 30-2, then outputs a high-amplitude drive signal DQ2B (a second amplified drive signal) obtained by increasing the amplitude of the drive signal DQ2 to the vibrator 10-2.

The drive circuit 30-3 (a third drive circuit) for the vibrator 10-3 receives a feedback signal DI3 (a third feedback signal) from the vibrator 10-3 (a third physical quantity transducer), and drives the vibrator 10-3. The detection circuit 60-3 (a third detection circuit) receives detection signals IQ31, IQ32 from the vibrator 10-3 to detect a desired signal.

The regulator circuit 22-3 (a third regulator circuit) performs a voltage adjustment for stepping down the power supply voltage VDD from the power supply terminal TVDD, and outputs the regulated power supply voltage VDDL3 (a third regulated power supply voltage) obtained by the voltage adjustment to the drive circuit 30-3 and the detection circuit 60-3.

Further, the buffer circuit 24-3 (a third buffer circuit) is supplied with the power supply voltage VDD, receives a drive signal DQ3 (a third drive signal) from the drive circuit 30-3, then outputs a high-amplitude drive signal DQ3B (a third amplified drive signal) obtained by increasing the amplitude of the drive signal DQ3 to the vibrator 10-3.

According to the configuration shown in FIG. 20 described above, the voltage adjustment for stepping down the power supply voltage VDD in the regulator circuits 22-1, 22-2, and 22-3 is performed. Then, regulated power supply voltages VDDL1, VDDL2, and VDDL3 thus obtained are supplied to the drive circuit 30-1 and the detection circuit 60-1, the drive circuit 30-2 and the detection circuit 60-2, and the drive circuit 30-3 and the detection circuit 60-3, respectively, as operating power supply voltages. Therefore, it is possible to keep the inter-axis interference to the minimum. For example, it is possible to keep the transmission of the power supply voltage variation due to the operations of the drive circuit 30-1 and the detection circuit 60-1 for, for example, the first axis to the drive circuits 30-2, 30-3 and the detection circuits 60-2, 60-3 for the rest of the axes, namely the second axis and the third axis, to the minimum using the regulator circuits 22-1, 22-2, and 22-3. Therefore, it becomes possible to reduce the inter-axis interference of the multiaxial gyro sensor to achieve an improvement of the detection performance.

Further, in FIG. 20, the buffer circuits 24-1, 24-2, and 24-3 are made to operate with the power supply voltage VDD input from the external through the terminal TVDD instead of the regulated power supply voltages, and generate the high-amplitude drive signals DQ1B, DQ2B, and DQ3B, respectively. Therefore, both of the shortening of the start-up time due to the high-amplitude drive and the improvement in the detection performance due to the reduction in the inter-axis interference can be realized.

Further, in FIG. 20, the detection device outputs the high-amplitude drive signal DQ1B from the buffer circuit 24-1 to the vibrator 10-1 in the first mode explained with reference to FIG. 19A. Similarly, in the first mode, the detection device outputs the high-amplitude drive signals DQ2B, DQ3B from the buffer circuits 24-2, 24-3 to the vibrators 10-2, 10-3, respectively.

In contrast, in the second mode explained with reference to FIG. 19B, the detection device outputs the low-amplitude drive signal DQ1 from the drive circuit 30-1 to the vibrator 10-1. Similarly, in the second mode, the detection device outputs the low-amplitude drive signals DQ2, DQ3 from the drive circuits 30-2, 30-3 to the vibrators 10-2, 10-3, respectively.

For example, in the start-up period of the oscillation, since the detection of the desired signal is not performed, the inter-axis interference does not present a significant problem.

Therefore, in the start-up period, the detection device is set to the first mode to arrange that the vibrators 10-1 through 10-3 are driven with the high-amplitude drive signals DQ1B through DQ3B, respectively. In contrast, after the start-up period of the oscillation is complete, in order to suppress the degradation of the detection performance due to the inter-axis interference and so on, it is arranged that the vibrators 10-1, 10-2, and 10-3 are driven with the low-amplitude drive signals DQ1 through DQ3. According to such a configuration, it becomes possible to realize both of the shortening of the start-up time of the oscillation and the improvement in the detection performance in the multiaxial gyro sensor and so on.

Further, in FIG. 20, an A/D converter circuit 100-1 (a first A/D converter circuit) and an A/D converter circuit 100-2 (a second A/D converter circuit) perform A/D conversion based on the clock signal (the clock signal obtained by dividing the frequency) from the clock signal generation circuit 150. An A/D converter circuit 100-3 (a third A/D converter circuit) also performs A/D conversion based on the clock signal from the clock signal generation circuit 150. The A/D converter circuits 100-1, 100-2, and 100-3 perform the A/D conversion using the clock signal as, for example, a sampling clock signal and an operating clock signal.

Further, the DSP section 110 receives digital signals from the A/D converter circuits 100-1, 100-2, and 100-3, and performs digital signal processing on the digital signals. Then, the DSP section 110 performs the digital signal processing based on the clock signal from the clock signal generation circuit 150. By adopting such a configuration, the digital signal processing such as digital filter processing can be performed at high speed.

For example, in the gyro sensor of the related art, there is adopted a method of making the A/D converter circuit and the DSP section operate using the clock signal generated based on the oscillation of the vibrator.

However, in the multiaxial gyro sensor shown in FIG. 20, in order to suppress the inter-axis interference described above, the drive frequencies (the vibrational frequencies, the oscillation frequencies) of the vibrators 10-1, 10-2, and 10-3 are different from each other.

Specifically, the closer the drive frequencies of the vibrators 10-1, 10-2, and 10-3 are, the more significantly the influence of the inter-axis interference appears. For example, in the case in which the difference in drive frequency between the vibrator 10-1 and the vibrator 10-2 is close to a detection detuning frequency of one of the vibrator 10-1 and the vibrator 10-2, the influence of the inter-axis interference appears significantly. In order to avoid the harmful influence of such inter-axis interference, in the present embodiment, there are used the vibrators 10-1, 10-2, and 10-3 far in frequency from each other. Specifically, the vibrator 10-1 vibrates at, for example, 110 kHz (a first frequency in a broad sense), and the vibrator 10-2 vibrates at, for example, 120 kHz (a second frequency different from the first frequency in a broad sense). Further, the vibrator 10-3 vibrates at, for example, 130 kHz (a third frequency different from the first and second frequencies in a broad sense).

Therefore, if adopting a method of making the A/D converter circuit and so on operate with the clock signal based on the oscillation of the vibrator, it becomes necessary to make the A/D converter circuits 100-1, 100-2, and 100-3 operate with the respective operating clock signals different in frequency from each other. Therefore, an interface for communicating the digital signals between the A/D converter circuits 100-1, 100-2, and 100-3, and the DSP section 110 becomes complicated. Further, it becomes difficult to determine the frequency of the clock signal with which the DSP section 110 is made to operate. As a result, the system design is complicated.

In this regard, in the present embodiment, the A/D converter circuits 100-1, 100-2, and 100-3 and the DSP section 110 are made to operate using the clock signal generated by the CR oscillator circuit 170 of the clock signal generation circuit 150 instead of the clock signals based on the oscillation of the vibrators 10-1, 10-2, and 10-3, respectively. Therefore, the interface for communicating the digital signals between the A/D converter circuits 100-1, 100-2, and 100-3, and the DSP section 110 can be simplified. As a result, it becomes possible to achieve the simplification of the system design and so on while keeping the inter-axis interference to the minimum.

10. Detection Circuit

Figure 21:
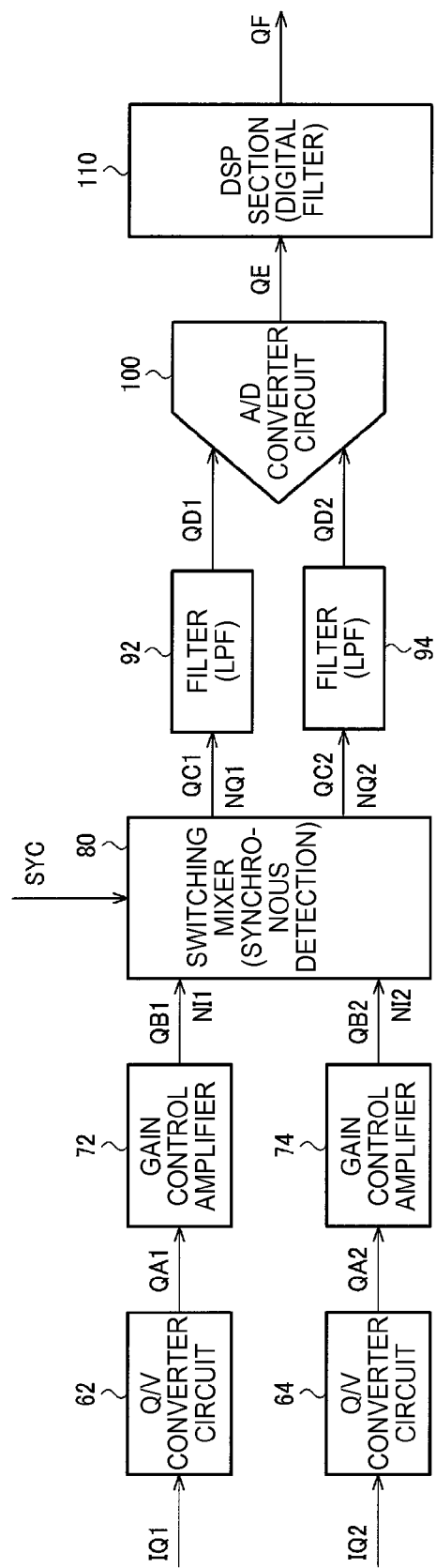
FIG. 21 is a diagram showing a detailed configuration example of a detection circuit.

FIG. 21 shows a detailed configuration example of the detection circuit 60. FIG. 21 shows an example of the detection circuit 60 using a fully differential switching mixer system.

The detection circuit 60 includes first and second Q/V converter circuits 62, 64, first and second gain control amplifiers 72, 74, a switching mixer 80, first and second filters 92, 94, and an A/D converter circuit 100. It should be noted that the configuration of the detection circuit 60 is not limited to FIG. 21, but a variety of practical modifications such as elimination of some of the constituents or addition of other constituents are possible.

First and second detection signals IQ1, IQ2 as a differential pair from the vibrator 10 are input to the Q/V converter circuits 62, 64 (charge-voltage converter circuits), respectively. Then, the Q/V converter circuits 62, 64 each convert a charge (a current) generated in the vibrator 10 into a voltage. These Q/V converter circuits 62, 64 are each a continuous charge-voltage converter circuit having a feedback resistor.

The gain control amplifiers 72, 74 amplify the output signals QA1, QA2 of the Q/V converter circuits 62, 64, respectively, while performing gain control. The gain control amplifiers 72, 74 are each a so-called programmable gain amplifier, and amplify the signals QA1, QA2 with set gains. For example, the gain control amplifiers 72, 74 amplify the signals QA1, QA2 into signals each having an amplitude suitable for the voltage conversion range of the A/D converter circuit 100.

The switching mixer 80 is a mixer for performing differential synchronous detection based on the sync signal SYC from the drive circuit 30. Specifically, in the switching mixer 80, an output signal QB1 of the gain control amplifier 72 is input to a first input node NI1, and an output signal QB2 of the gain control amplifier 74 is input to a second input node NI2. Then, the switching mixer 80 performs the differential synchronous detection with the sync signal SYC from the drive circuit 30, and then outputs first and second output signals QC1, QC2 as a differential pair to first and second output nodes NQ1, NQ2, respectively. The switching mixer 80 performs a frequency conversion on an unwanted signal such as noise (1/f noise) generated by circuits (the Q/V converter circuit, a gain control amplifier) in the anterior stage into a high frequency band. Further, a desired signal as a signal corresponding to a Coriolis force is made to fall in a direct-current signal.

The first output signal QC1 from the first output node NQ1 of the switching mixer 80 is input to the filter 92. The second output signal QC2 from the second output node NQ2 of the switching mixer 80 is input to the filter 94. These filters 92, 94 are each a low-pass filter having a frequency characteristic of eliminating (attenuating), for example, an unwanted signal and transmitting a desired signal. For example, the unwanted signal such as the 1/f noise, which has been frequency-converted into the high frequency band by the switching mixer 80, is removed by the filters 92, 94. Further, the filters 92, 94 are each, for example, a passive filter formed of passive elements. In other words, as the filters 92, 94, there can be adopted a passive filter formed of the passive elements such as resistor elements or capacitors without using an operational amplifier.

The A/D converter circuit 100 receives an output signal QD1 from the filter 92 and an output signal QD2 from the filter 94 to perform differential A/D conversion. Specifically, the A/D converter circuit 100 performs sampling of the output signals QD1, QD2 using the filters 92, 94 as anti-aliasing filters (prefilters) to perform the A/D conversion. Further, in the present embodiment, the output signal QD1 from the filter 92 and the output signal QD2 from the filter 94 are input to the A/D converter circuit 100 without intervention of an active element.

As the A/D converter circuit 100, there can be adopted an A/D converter circuit of a variety of types such as a delta-sigma type or a successive-approximation type. In the case of adopting the delta-sigma type, it is possible to use an A/D converter circuit having functions of, for example, correlated double sampling (CDS) for reducing the 1/f noise and a chopper, and formed of, for example, a second-order delta-sigma modulator. Further, in the case of adopting the successive-approximation type, it is possible to use an A/D converter circuit having a function of, for example, dynamic element matching (DEM) for suppressing a deterioration of the S/N ratio due to an element variation of DAC, and formed of a capacitive DAC and a successive approximation control logic.

The DSP section 110 performs a variety of types of digital signal processing. For example, the DSP section 110 performs band-limiting digital filter processing corresponding to an application of a desired signal, and digital filter processing for eliminating noise generated by the A/D converter circuit 100 and so on. Further, the DSP section 110 performs a digital correction process such as a gain correction (a sensitivity adjustment) or an offset correction.

In the detection device 20 shown in FIG. 21, there is adopted the fully differential switching mixer system. According to the fully differential switching mixer system, the 1/f noise and so on generated in the Q/V converter circuit 62, 64 and the gain control amplifiers 72, 74 are eliminated by the frequency conversion in the switching mixer 80 and the low-pass filter characteristic by the filters 92, 94. Further, there is adopted a configuration in which the switching mixer 80 not generating the 1/f noise although a high gain cannot be obtained, and the filters 92, 94 formed of low-noise passive elements are disposed between the gain control amplifiers 72, 74 and the A/D converter circuit 100. Therefore, since the noise having been generated in the Q/V converter circuits 62, 64 and the gain control amplifiers 72, 74 is eliminated, and at the same time, the noise generated by the switching mixer 80 and the filters 92, 94 can be kept to the minimum, it becomes possible to input the signals QD1, QD2 in the low-noise state to the A/D converter circuit 100 to perform the A/D conversion. Moreover, since the signals QD1, QD2 can be A/D converted as a differential signal, it becomes possible to further improve the S/N ratio compared to the case of performing the A/D conversion as a single-end signal.

It should be noted that the detection device 20 according to the present embodiment is not limited to the configuration of the fully differential switching mixer system as shown in FIG. 21. It is possible to adopt a variety of configurations such as a configuration of a direct sampling system formed of a discrete Q/V converter circuit and an A/D converter circuit directly connected to the discrete Q/V converter circuit.

Figure 22:
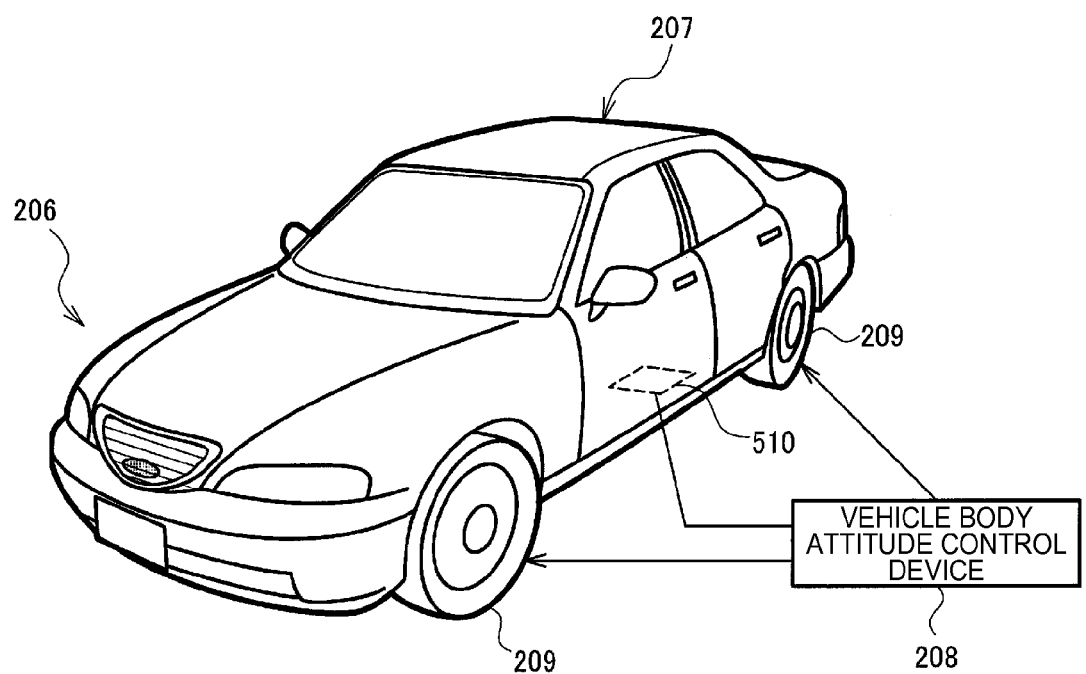
FIG. 22 is a conceptual diagram schematically showing a configuration of a vehicle as a specific example of a moving object.

FIG. 22 shows an example of a moving object including the detection device 20 according to the present embodiment. The detection device 20 according to the present embodiment can be incorporated in a variety of moving objects such as a vehicle, an airplane, a motorbike, a bicycle, a ship, or a boat. The moving object is equipment or a device provided with a drive mechanism such as an engine or an electric motor, a steering mechanism such as a steering wheel or a helm, and a variety of electronic apparatuses, and moving on the ground, in the air, or on the sea. FIG. 22 schematically shows a vehicle 206 as a specific example of a moving object. The vehicle 206 incorporates a gyro sensor 510 (a sensor) including the vibrator 10 and the detection device 20. The gyro sensor 510 is capable of detecting the posture of the vehicle body 207. The detection signal of the gyro sensor 510 can be supplied to a vehicle body attitude control device 208. The vehicle body attitude control device 208 is capable of, for example, controlling the stiffness of the suspension, and controlling the brake of each of the wheels 209 in accordance with the attitude of the vehicle body 207. Besides the above, such attitude control as described above can be used for a variety of moving objects such as a two-legged robot, an airplane, and a helicopter. In realizing the attitude control, the gyro sensor 510 can be incorporated.

It should be noted that although the present embodiment is hereinabove explained in detail, it should easily be understood by those skilled in the art that it is possible to make a variety of modifications not substantially departing from the novel matters and the advantage of the invention. Therefore, such modified examples should be included in the scope of the invention. For example, a term (e.g., gyro sensor or vibrator) described at least once with a different term (e.g., sensor or physical quantity transducer) having a broader sense or the same meaning in the specification or the accompanying drawings can be replaced with the different term in any part of the specification or the accompanying drawings. Further, the configurations of the clock signal generation circuit, the detection device, the electronic apparatus, and the moving object, the structure of the vibrator, and so on are not limited to those explained in the present embodiment, but can be put into practice in variously modified forms.

The entire disclosure of Japanese Patent Application No. 2013-244626, filed Nov. 27, 2013 is expressly incorporated by reference herein.

What is claimed is:

1. A clock signal generation circuit comprising:
 a CR oscillator circuit including a capacitor, a first resistor, and an amplifier circuit; and
 a voltage generation circuit adapted to generate a power supply voltage, and supply the CR oscillator circuit with the power supply voltage, wherein the voltage generation circuit includes a first transistor, a second transistor, and a second resistor, a gate electrode of the second transistor has a conductivity that is different from that of the first transistor, and the second resistor receives a voltage based on a work function difference between the first transistor and the second transistor, further wherein:
 an oscillation frequency of the CR oscillator circuit in a case in which the power supply voltage is a fixed voltage has a positive temperature characteristic, and
 the voltage generation circuit generates the power supply voltage having a negative temperature characteristic based on a work function difference between the first transistor and the second transistor, and supplies the power supply voltage as a power for the amplifier circuit of the CR oscillator circuit.

2. The clock signal generation circuit according to claim 1, wherein
the first resistor includes
a plurality of resistor elements and a reference resistor element connected in series to each other,
a plurality of fuse elements disposed corresponding respectively to the resistor elements in parallel to the corresponding resistor elements, and
a trimming auxiliary switch disposed in parallel to the reference resistor element, set to an OFF state in a first measurement mode of an oscillation frequency before cutting the fuse element, and set to an ON state in a second measurement mode of the oscillation frequency before cutting the fuse element.

3. An electronic apparatus comprising:
the clock signal generation circuit according to claim 2; and
a display section that displays information.

4. A moving object comprising:
the clock signal generation circuit according to claim 2; and
a drive mechanism to provide a drive force.

5. An electronic apparatus comprising:
the clock signal generation circuit according to claim 1; and
a display section that displays information.

6. A moving object comprising:
the clock signal generation circuit according to claim 1; and
a drive mechanism to provide a drive force.

7. A detection device comprising:
a clock signal generation circuit that includes:
a CR oscillator circuit including a capacitor, a resistor, and an amplifier circuit, and
a voltage generation circuit adapted to generate a power supply voltage, and supply the CR oscillator circuit with the power supply voltage, wherein an oscillation frequency of the CR oscillator circuit in a case in which the power supply voltage is a fixed voltage has a positive temperature characteristic, and the voltage generation circuit generates the power supply voltage having a negative temperature characteristic based on a work function difference between transistors, and supplies the power supply voltage as a power for the amplifier circuit of the CR oscillator circuit;
a drive circuit adapted to receive a feedback signal from a physical quantity transducer and drive the physical quantity transducer;
a detection circuit adapted to receive a detection signal from the physical quantity transducer to detect a desired signal; and
a control section adapted to receive the clock signal from the clock signal generation circuit, and control the drive circuit and the detection circuit.

8. The detection device according to claim 7, wherein
the clock signal generation circuit is set to an operation enable state by releasing a power-on reset state, and supplies the control section with the clock signal, and
the control section having started an operation due to the supply of the clock signal starts up the drive circuit and the detection circuit.

9. A detection device comprising:
a clock signal generation circuit adapted to generate a clock signal using a CR oscillator circuit;
a drive circuit adapted to receive a feedback signal from a physical quantity transducer and drive the physical quantity transducer;
a detection circuit adapted to receive a detection signal from the physical quantity transducer to detect a desired signal; and
a control section adapted to receive the clock signal from the clock signal generation circuit, and control the drive circuit and the detection circuit,
wherein the CR oscillator circuit operates being supplied with a power supply voltage having a negative temperature characteristic,
the clock signal generation circuit is set to an operation enable state by releasing a power-on reset state, and supplies the control section with the clock signal, and
the control section having started an operation due to the supply of the clock signal starts up the drive circuit and the detection circuit.

10. The detection device according to claim 7, wherein
the physical quantity transducer is a vibrator,
the drive circuit includes
an amplifier circuit adapted to amplify the feedback signal,
a drive signal output circuit adapted to output a drive signal of the vibrator,
a gain control circuit adapted to control an amplitude of the drive signal, and
a high-pass filter disposed between the amplifier circuit and the drive signal output circuit, and
the clock signal from the clock signal generation circuit is input to the drive signal output circuit via a resistor element constituting the high-pass filter in a start-up period of an oscillation of the vibrator.

11. The detection device according to claim 7, further comprising:
a second drive circuit adapted to receive a second feedback signal from a second physical quantity transducer, and drive the second physical quantity transducer; and
a second detection circuit adapted to receive a second detection signal from the second physical quantity transducer to detect a desired signal,
wherein the detection circuit includes a first A/D converter circuit,
the second detection circuit includes a second A/D converter circuit, and
the first A/D converter circuit and the second A/D converter circuit each convert an analog signal into a digital signal based on the clock signal from the clock signal generation circuit.

12. The detection device according to claim 11, wherein
the control section includes a digital signal processing section adapted to receive the digital signals from the first A/D converter circuit and the second A/D converter circuit, and perform digital signal processing on the digital signals, and
the digital signal processing section adapted to perform the digital signal processing based on the clock signal from the clock signal generation circuit.

13. The detection device according to claim 11, wherein
the physical quantity transducer is a vibrator adapted to detect a rotational angular velocity around a first axis,
the second physical quantity transducer is a second vibrator adapted to detect a rotational angular velocity around a second axis, and
the vibrator vibrates at a first frequency, and the second vibrator vibrates at a second frequency different from the first frequency.

14. A sensor comprising:
the detection device according to claim 7; and
a physical quantity transducer.

15. The detection device according to claim 7, further comprising:
a power supply terminal to which an external power supply voltage is input; and
a regulator circuit adapted to perform a voltage adjustment of stepping down the external power supply voltage from the power supply terminal, and supply a regulated power supply voltage obtained by the voltage adjustment to the drive circuit and the detection circuit as an operating power supply voltage,
wherein the voltage generation circuit generates the power supply voltage based on the regulated power supply voltage.

16. The detection device according to claim 15, further comprising:
a buffer circuit supplied with the external power supply voltage, and adapted to receive a drive signal from the drive circuit, and output an amplified drive signal, which is obtained by increasing an amplitude of the drive signal, to the physical quantity transducer.

17. The detection device according to claim 16, wherein
the amplified drive signal from the buffer circuit is output to the physical quantity transducer in a first mode, and
the drive signal from the drive circuit is output to the physical quantity transducer in a second mode.

18. The detection device according to claim 17, wherein
the physical quantity transducer is a vibrator, and
the first mode is set to output the amplified drive signal from the buffer circuit to the vibrator in a start-up period of an oscillation of the vibrator.

19. A sensor comprising:
the detection device according to claim 8; and
a physical quantity transducer.

20. A sensor comprising:
the detection device according to claim 9; and
a physical quantity transducer.

* * * * *